US 12,406,727 B2

United States Patent
Shimada et al.

(10) Patent No.: US 12,406,727 B2
(45) Date of Patent: Sep. 2, 2025

(54) MEMORY DEVICE

(71) Applicant: Kioxia Corporation, Tokyo (JP)

(72) Inventors: Yu Shimada, Fujisawa Kanagawa (JP); Ryousuke Takizawa, Naka Kanagawa (JP); Akira Katayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 18/460,493

(22) Filed: Sep. 1, 2023

(65) Prior Publication Data

US 2024/0112732 A1    Apr. 4, 2024

(30) Foreign Application Priority Data

Sep. 22, 2022  (JP) ................. 2022-151313

(51) Int. Cl.
*G11C 13/00*  (2006.01)

(52) U.S. Cl.
CPC ...... *G11C 13/0069* (2013.01); *G11C 13/0038* (2013.01); *G11C 13/004* (2013.01)

(58) Field of Classification Search
CPC ..... G11C 16/0483; G11C 16/08; G11C 16/10; G11C 16/30; G11C 16/32; G11C 11/5628; G11C 16/16; G11C 16/24; G11C 16/3427; G11C 2207/002; G11C 7/12; G11C 7/18; G11C 16/04; G11C 16/34; G11C 7/10; H10B 43/27; H10B 43/35; H10B 69/00; H10B 10/125
See application file for complete search history.

(56) References Cited

U.S. PATENT DOCUMENTS

| | | | |
|---|---|---|---|
| 7,423,898 B2 | 9/2008 | Tanizaki | |
| 10,304,528 B2 | 5/2019 | Terada | |
| 2003/0156448 A1 | 8/2003 | Hidaka | |
| 2006/0139987 A1 | 6/2006 | Kang et al. | |
| 2021/0020236 A1 | 1/2021 | Baek et al. | |

(Continued)

FOREIGN PATENT DOCUMENTS

| | | |
|---|---|---|
| CN | 112242164 A | 1/2021 |
| JP | 4890016 B2 | 3/2012 |

(Continued)

OTHER PUBLICATIONS

Taiwanese Office Action dated Apr. 29, 2024 in Taiwanese Patent Application 11320420210, 10 pages.

(Continued)

*Primary Examiner* — Thong Q Le
(74) *Attorney, Agent, or Firm* — Kim & Stewart LLP

(57) ABSTRACT

A memory device includes a memory cell connected between first and second signal lines, a first wiring connected to the first signal line, a second wiring connected to the second signal line, and a precharging circuit connected to the first wiring. During a write sequence, the precharging circuit charges the first signal line and the first wiring, the memory cell is activated according to a voltage difference between the first signal line and the second signal line, and a write current generated from parasitic capacitances of both the charged first signal line and the charged first wiring flows from the first wiring to the second wiring via the activated memory cell.

20 Claims, 22 Drawing Sheets

(56) References Cited

U.S. PATENT DOCUMENTS

2021/0295888 A1    9/2021  Osada
2021/0295916 A1*   9/2021  Li ......................... G11C 16/16

FOREIGN PATENT DOCUMENTS

JP         6734263 B2     8/2020
JP       2021-150497 A    9/2021
WO       2010059177 A1    5/2010

OTHER PUBLICATIONS

Li et al., "Thermally assisted magnetization reversal in the presence of a spin-transfer torque", Physical Review B 69, 2004, pp. 134416-1 to 134416-6.

* cited by examiner

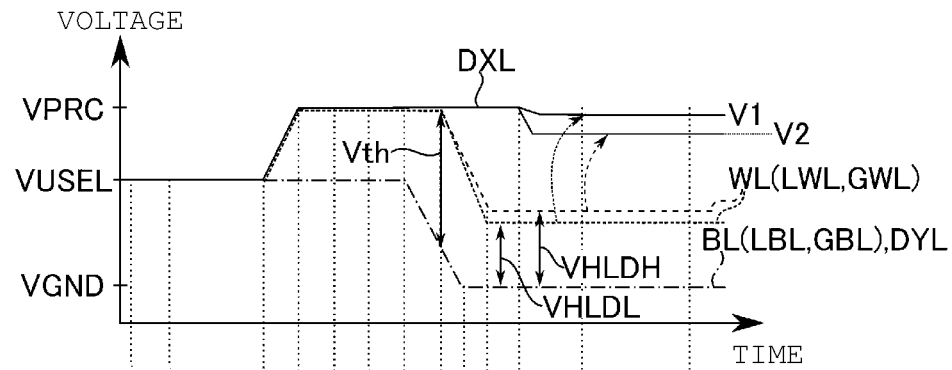
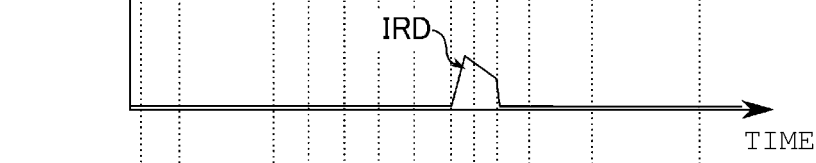
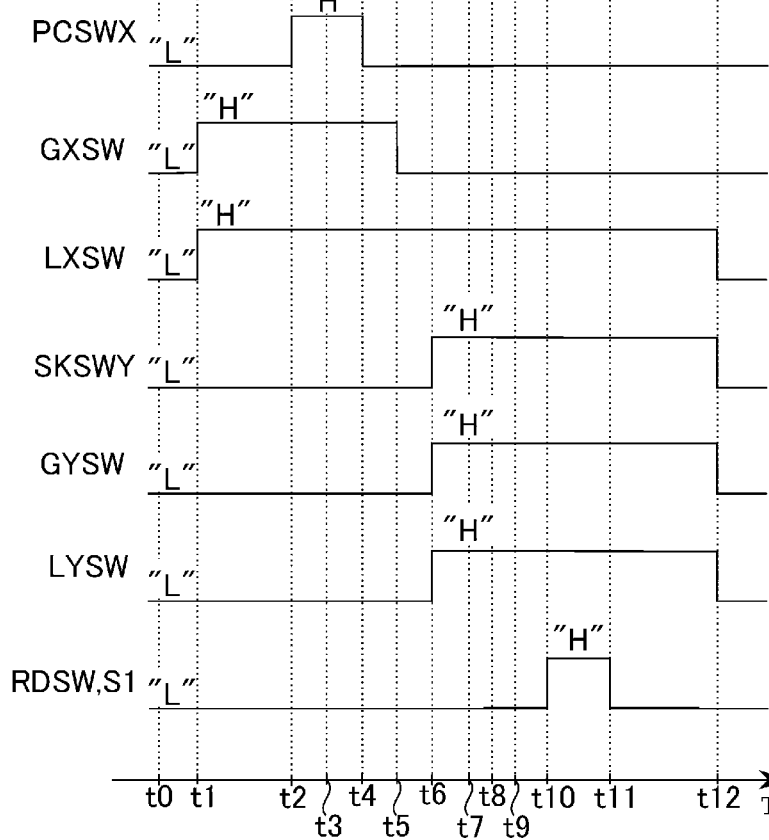

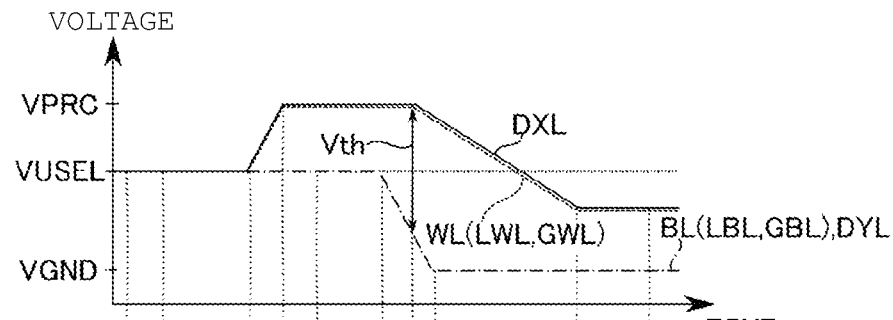
FIG. 12A
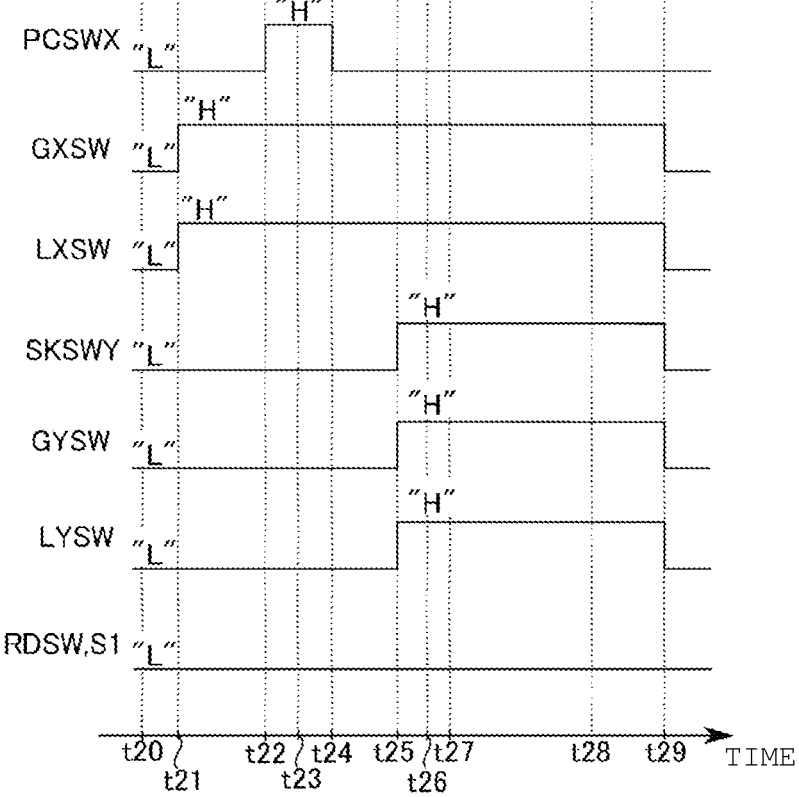
FIG. 12B
FIG. 12C

MEMORY DEVICE

CROSS-REFERENCE TO RELATED APPLICATION(S)

This application is based upon and claims the benefit of priority from Japanese Patent Application No. 2022-151313, filed Sep. 22, 2022, the entire contents of which are incorporated herein by reference.

FIELD

Embodiments described herein relate generally to a memory device.

BACKGROUND

A memory device using a variable resistance element (for example, a magnetoresistance effect element) as a memory element is known. In order to improve characteristics of the memory devices, various technologies related to the memory devices have been researched and developed.

DESCRIPTION OF THE DRAWINGS

FIGS. 8A to 8C are timing diagrams illustrating a read operation example of the memory device according to the first embodiment.

FIGS. 12A to 12C are timing diagrams illustrating a write operation example of the memory device according to the first embodiment.

DETAILED DESCRIPTION

Figure 1:
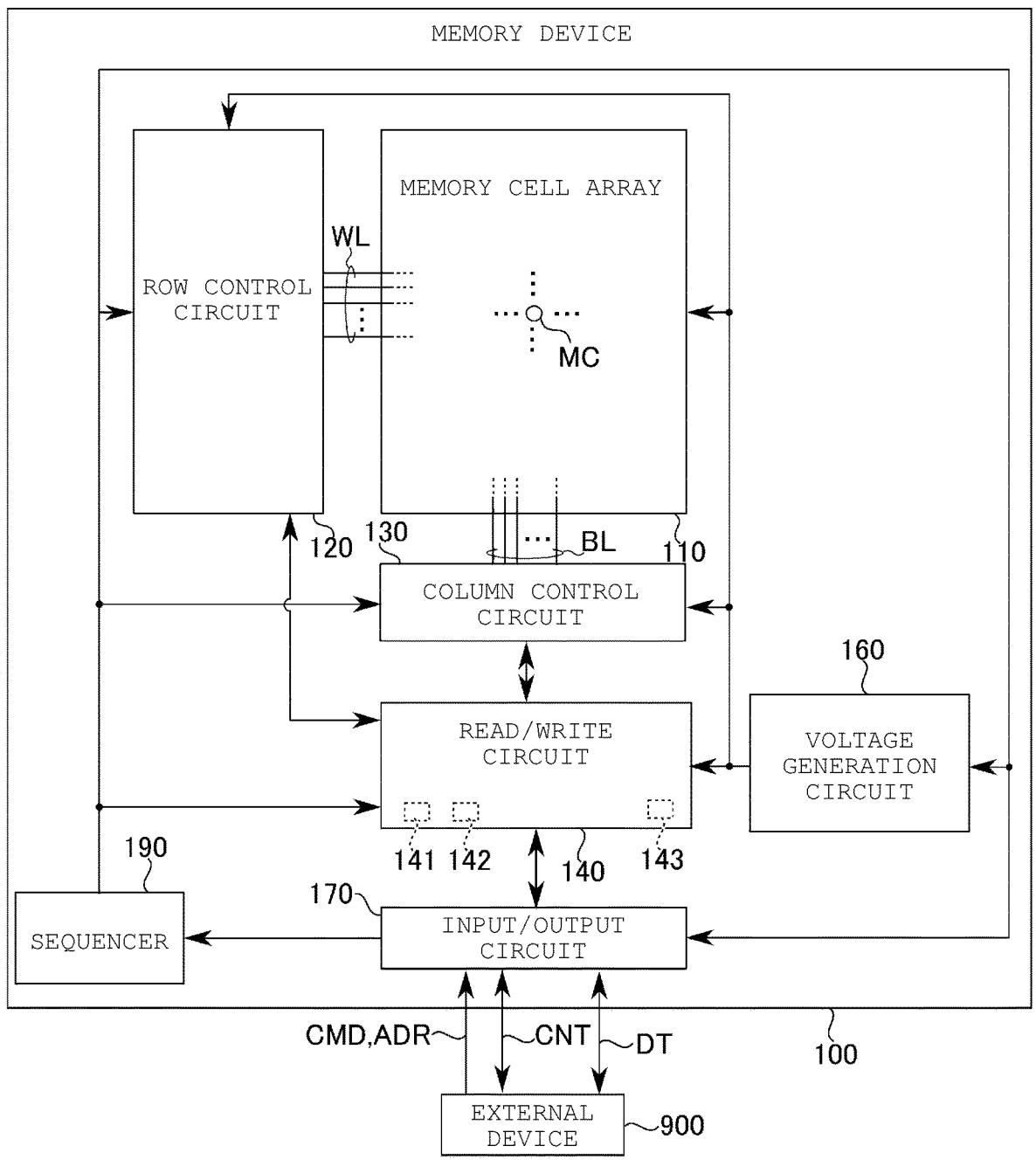
FIGS. 1-3 are diagrams illustrating a configuration example of a memory device according to a first embodiment.

Embodiments provide an improvement in operating characteristics of a memory device.

In general, according to one embodiment, there is provided a memory device including: a memory cell connected between a first signal line and a second signal line; a first wiring connected to the first signal line via a first switch; a second wiring connected to the second signal line via a second switch; and a first precharging circuit connected to the first wiring, in which, during a write sequence for the memory cell, the first precharging circuit charges the first signal line and the first wiring which are connected via the first switch in an on state, the memory cell is activated according to a voltage difference between the first signal line and the second signal line, and a write current generated from the charged first signal line and the charged first wiring flows from the first wiring to the second wiring via the activated memory cell.

A memory device according to an embodiment will be described with reference to FIGS. 1 to 23B.

Hereinafter, embodiments will be described in detail with reference to the drawings. In the following description, elements having the same functions and configurations are denoted by the same reference numerals. In addition, in each of the following embodiments, when elements (for example, circuits, wirings, various voltages, signals, and the like) identified with reference symbols with numerals/alphabetical letters added at the ends, need not be distinguished from each other, these elements are identified with reference symbols without the numerals/alphabetical letters added at the ends.

(1) First Embodiment

A memory device according to a first embodiment will be described with reference to FIGS. 1 to 13.

(a) Configuration Example

A configuration example of a memory device 100 according to the embodiment will be described with reference to FIGS. 1 to 6.

FIG. 1 is a schematic diagram illustrating the overall configuration of the memory device 100 according to the embodiment. As illustrated in FIG. 1, the memory device 100 according to the embodiment is connected to a device (hereinafter referred to as an external device) 900 external to the memory device 100.

The external device 900 transmits commands CMD, addresses ADR, and control signals CNT to the memory device 100. Data DT is transferred between the memory device 100 and the external device 900. During a write operation, the external device 900 transmits data (hereinafter referred to as write data) to be written in the memory device 100 to the memory device 100. During a read operation, the external device 900 receives data (hereinafter referred to as read data) read from the memory device 100 from the memory device 100.

The memory device 100 according to the embodiment includes a memory cell array 110, a row control circuit 120, a column control circuit 130, a read/write circuit 140, a voltage generation circuit 160, an input/output circuit 170, and a sequencer 190.

The memory cell array 110 includes a plurality of memory cells MC, a plurality of word lines WL, and a plurality of bit lines BL. The word lines WL and the bit lines BL are also referred to as signal lines or control lines.

The plurality of memory cells MC are associated with a plurality of rows and a plurality of columns in the memory cell array 110. Each memory cell MC is connected to a corresponding one among the plurality of word lines WL. Each memory cell MC is connected to a corresponding one among the plurality of bit lines BL.

For example, the plurality of word lines WL have a hierarchical word line structure. That is, each word line WL includes a local word line and a global word line. For example, the plurality of bit lines BL have a hierarchical bit line structure. That is, each bit line BL includes a local bit line and a global bit line.

The row control circuit 120 is connected to the memory cell array 110 via the word line WL. The row control circuit 120 receives the result (in particular, row address) of decoding the row address of the memory cell array 110 in the address ADR. The row control circuit 120 controls the plurality of word lines WL based on the result of decoding the row address. Accordingly, the row control circuit 120 sets each of the plurality of word lines WL to a selected state or a non-selected state. In the following, the word line WL set to the selected state based on the address ADR is referred to as a selected word line WL, and the word lines WL other than the selected word line WL are referred to as non-selected word lines WL.

The column control circuit 130 is connected to the memory cell array 110 via the bit line BL. The column control circuit 130 receives the result (in particular, column address) of decoding a column address of the memory cell array 110 in the address ADR. The column control circuit 130 controls the plurality of bit lines BL based on the result of decoding the column address. Accordingly, the column control circuit 130 sets each of the plurality of bit lines BL to the selected state or the non-selected state. In the following, the bit line BL set to the selected state based on the address ADR is referred to as a selected bit line BL, and the bit lines BL other than the selected bit line BL are referred to as non-selected bit lines BL.

The read/write circuit 140 writes data to the memory cells MC and reads data from the memory cells MC.

During the writing of data, the read/write circuit 140 supplies a voltage (or a current) for writing data to each of the selected word line WL and the selected bit line BL. Accordingly, the read/write circuit 140 writes data to the memory cell MC.

During the reading of data, the read/write circuit 140 senses a signal output from the selected memory cell MC. The read/write circuit 140 determines data in the memory cell MC based on the sensed signal. Accordingly, the read/write circuit 140 reads data from the memory cell MC.

The read/write circuit 140 includes a sense amplifier circuit 141, a precharging circuit 142, a sink circuit 143, and the like. In the embodiment depicted in FIG. 1, the read/write circuit 140 does not include a current source circuit (or a voltage source circuit) generating the write current, and the read/write circuit 140 does not include a current source circuit (or a voltage source circuit) generating a read current.

The voltage generation circuit 160 uses a power supply voltage supplied from the external device 900 to generate voltages for various operations of the memory cell array 110. For example, the voltage generation circuit 160 generates various voltages used in the write operation. For example, the voltage generation circuit 160 generates various voltages used in the read operation. The voltage generation circuit 160 outputs the generated voltage to the read/write circuit 140.

The input/output circuit 170 functions as an interface circuit for various signals ADR, CMD, CNT, and DT between the memory device 100 and the external device 900. The input/output circuit 170 transfers the address ADR from the external device 900 to the sequencer 190. The input/output circuit 170 transfers the command CMD from the external device 900 to the sequencer 190. The input/output circuit 170 transfers the various control signals CNT between the external device 900 and the sequencer 190. The input/output circuit 170 transfers the write data DT from the external device 900 to the read/write circuit 140. The input/output circuit 170 transfers the data DT from the read/write circuit 140 to the external device 900 as the read data.

The sequencer (also referred to as a control circuit, a state machine, or an internal controller) 190 decodes the command CMD. The sequencer 190 controls operations of the row control circuit 120, the column control circuit 130, the read/write circuit 140, the voltage generation circuit 160, and the input/output circuit 170 in the memory device 100 based on the result of decoding the command CMD and the control signal CNT. The sequencer 190 decodes the address ADR. The sequencer 190 transmits the result of decoding the address ADR to the row control circuit 120, the column control circuit 130, and the like. For example, the sequencer 190 includes a register circuit (not illustrated) temporarily storing the command CMD and the address ADR. It is noted that the register circuit, the circuit for decoding the command CMD (referred to herein as a command decoder), and the circuit for decoding the address ADR (referred to herein as an address decoder) may be provided in the memory device 100 outside the sequencer 190.

A configuration example of the memory cell array 110 and circuits in the vicinity thereof in the memory device 100 according to the embodiment will be described with reference to FIGS. 2 and 3.

Figure 2:
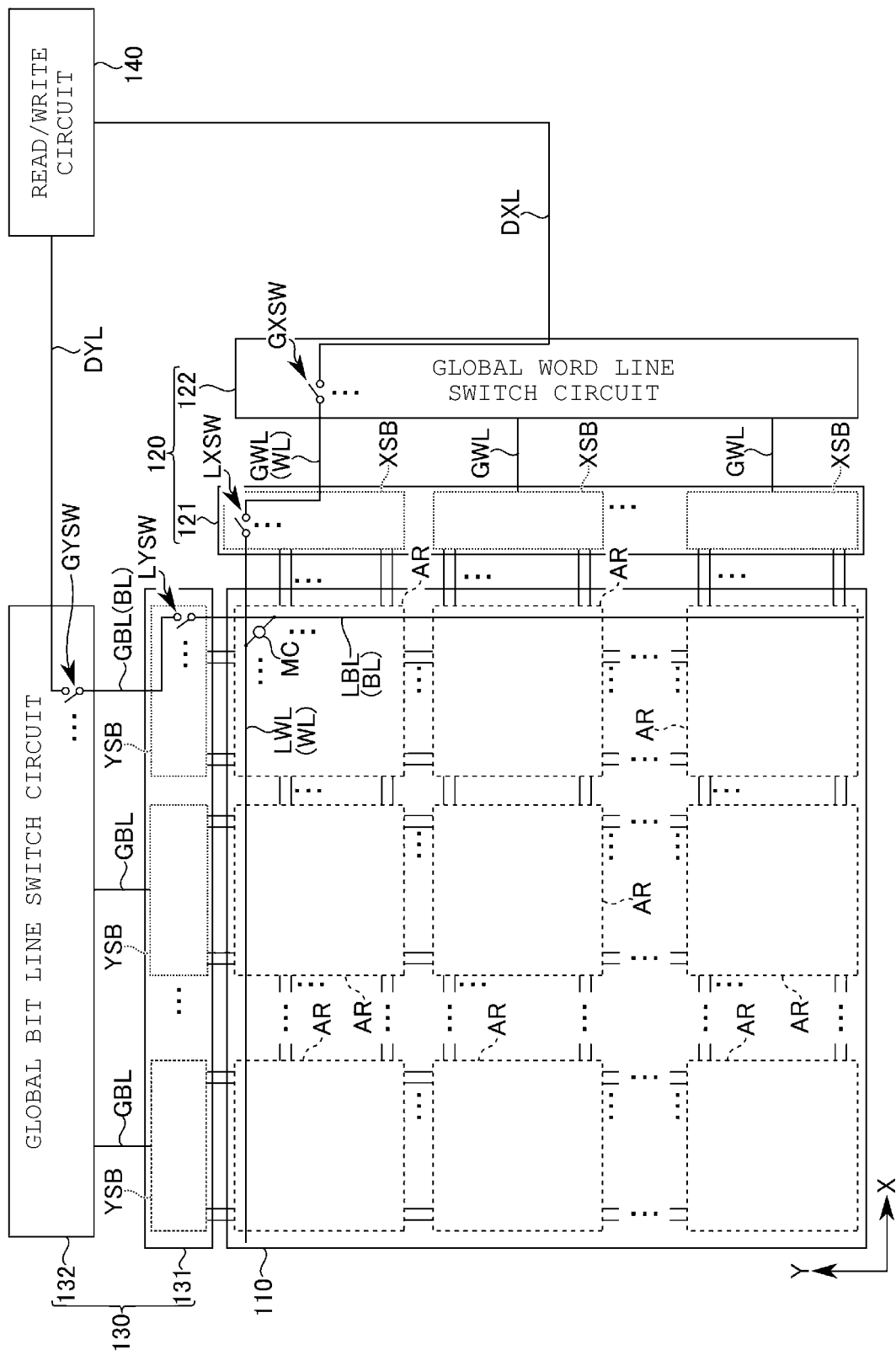

FIG. 2 is a schematic diagram illustrating the configuration of the memory cell array 110 and the vicinity thereof in the memory device 100 according to the embodiment.

As illustrated in FIG. 2, the memory cell array 110 includes a plurality of array regions AR. In the following, an array region AR corresponds to a block, segment, or tile of memory cells.

The array region AR is a logical area that can be selected by the row address (for example, a global word line address) and the column address (for example, a global bit line address).

Each array region AR includes a plurality of memory cells MC. Each memory cell MC is connected to one local word line LWL and one local bit line LBL. The memory cell MC can store data of one bit or more.

As described above, the word lines WL have a hierarchical word line structure, such that each word line WL includes the local word line LWL and a global word line GWL.

The plurality of local word lines LWL are provided in each array region AR. Each local word line LWL extends in the X direction. For example, each local word line LWL straddles the plurality of array regions AR located along the X direction. One end of the local word line LWL is connected to the row control circuit 120.

As described above, the bit lines BL have a hierarchical bit line structure, such that each bit line BL includes the local bit line LBL and a global bit line GBL.

The plurality of local bit lines LBL are provided in each array region AR. The local bit line LBL extends in the Y direction. For example, the local bit line LBL straddles the plurality of array regions AR located in the Y direction. One end of the local bit line LBL is connected to the column control circuit 130.

The row control circuit 120 includes a plurality of hierarchically-arranged switch circuits 121 and 122.

The switch circuit 121 is connected to the plurality of local word lines LWL. The switch circuit 121 selects to activate the local word line LWL corresponding to the address ADR among the plurality of local word lines LWL based on the address ADR. In the following, the switch circuit 121 is referred to as a local word line switch circuit 121.

The local word line switch circuit 121 includes a plurality of switches LXSW. One end of each switch LXSW is connected to a corresponding one among the plurality of local word lines LWL. The other end of each switch LXSW is connected to a corresponding one among the plurality of global word lines GWL. In the following, the switch LXSW is referred to as a local word line switch LXSW.

The local word line switch circuit 121 includes a set XSB of the plurality of local word line switches LXSW as a control unit. In the following, the set XSB of the plurality of local word line switches LXSW is referred to as a row switch box XSB.

Each row switch box XSB is associated with the plurality of array regions AR arranged in the X direction. Each row switch box XSB is associated with a corresponding one among the plurality of global word lines GWL. The result of decoding the row address (for example, the result of decoding the local word line address) is supplied to each of the plurality of row switch boxes XSB.

The switch circuit 122 is connected to the plurality of global word lines GWL. The switch circuit 122 selects (to activate) one among the global word lines GWL based on the address ADR. In the following, the switch circuit 122 is referred to as a global word line switch circuit 122.

The global word line switch circuit 122 includes a plurality of switches GXSW. One end of each switch GXSW is connected to a corresponding one among the plurality of global word lines GWL. The other end of each switch GXSW is connected to a data wiring DXL which extends in the X-direction. In the following, the switch GXSW is referred to as a global word line switch GXSW.

The global word line switch circuit 122 is connected to the read/write circuit 140 via the data wiring DXL.

Thus, the word lines WL of the memory cell array 110 are hierarchically-arranged by the local word lines LWL and the global word lines GWL. In the following, a set including the local word lines LWL and the global word lines GWL is also referred to as a word line WL.

The column control circuit 130 includes the plurality of hierarchically-arranged switch circuits 131 and 132.

The switch circuit 131 is connected to the plurality of local bit lines LBL. The switch circuit 131 selects (to activate) the local bit line LBL corresponding to the address ADR among the plurality of local bit lines LBL based on the address ADR. The switch circuit 131 is hereinafter referred to as a local bit line switch circuit 131.

The local bit line switch circuit 131 includes a plurality of switches LYSW. The plurality of switches LYSW are respectively connected to the plurality of local bit lines LBL. In the following, the switches LYSW are referred to as a local bit line switches LYSW.

The local bit line switch circuit 131 includes a set YSB of the plurality of local bit line switches LYSW as a control unit. The set YSB of the plurality of local bit line switches LYSW is hereinafter referred to as a column switch box YSB.

Each column switch box YSB is associated with the plurality of array regions AR arranged in the Y direction. Each column switch box YSB is associated with a corresponding one of the plurality of global bit lines GBL. The result of decoding the column address (for example, a result of decoding the local bit line address) is supplied to each of the plurality of column switch boxes YSB.

The switch circuit 132 is connected to the plurality of global bit lines GBL. The switch circuit 132 selects (to activate) one among the plurality of global bit lines GBL based on the address ADR. Hereinafter, the switch circuit 132 is referred to as a global bit line switch circuit 132.

The global bit line switch circuit 132 includes a plurality of switches GYSW. One end of each switch GYSW is connected to a corresponding one among the plurality of global bit lines GBL. The other end of each switch GYSW is connected to a data wiring DYL, which extends in the Y-direction. In the following, the switch GYSW is referred to as a global bit line switch GYSW.

The global bit line switch circuit 132 is connected to the read/write circuit 140 via the data wiring DXL.

In this manner, the bit lines of the memory cell array 110 are hierarchically-arranged by the local bit lines LBL and the global bit lines GBL. In the following, the set including the local bit lines LBL and the global bit lines GBL is also referred as a bit line BL.

With the configuration of FIG. 2, one array region AR among the plurality of array regions AR in the memory cell array 110 is set to a selected state (active state) based on the address ADR.

Figure 3:
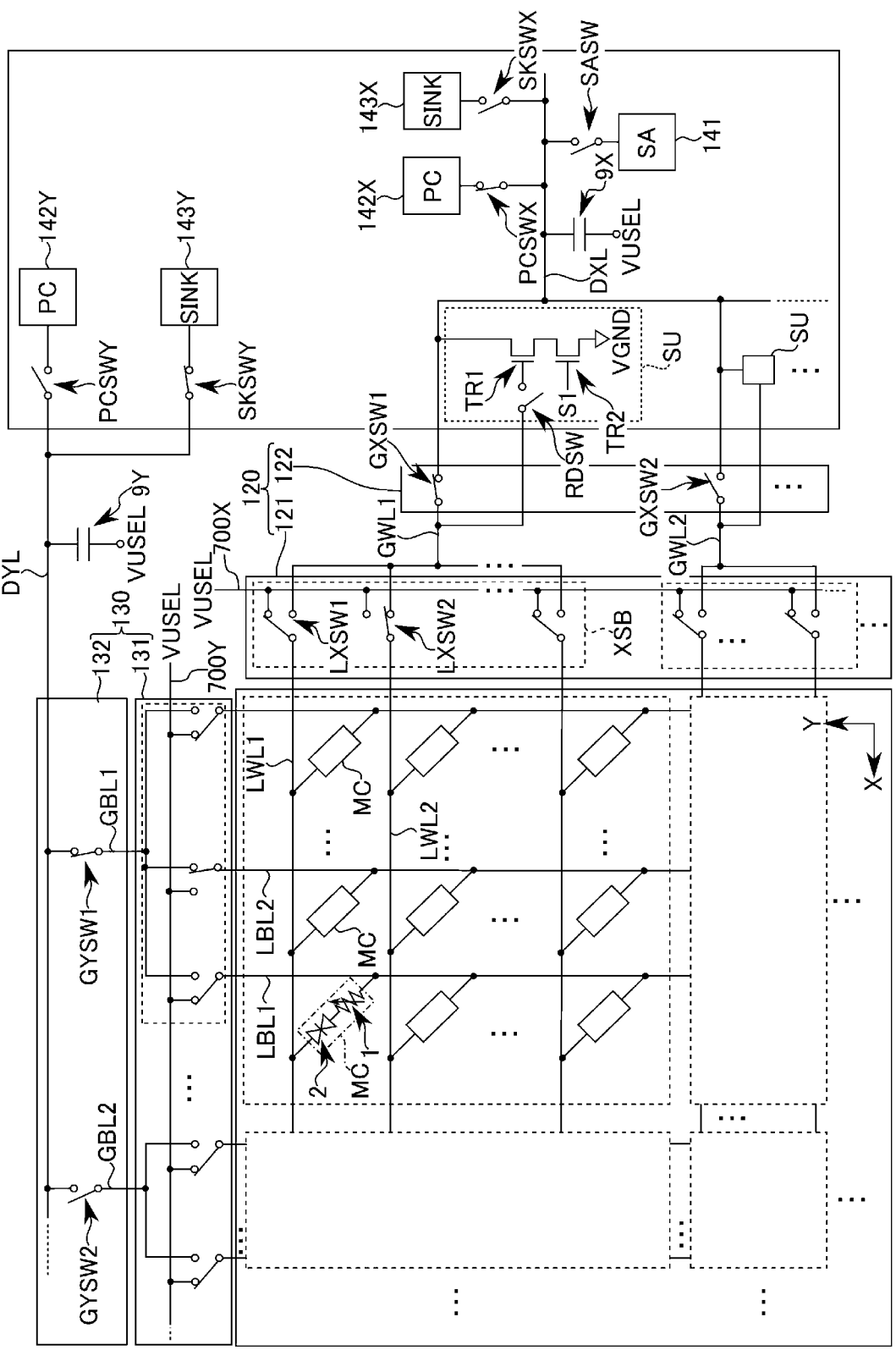

FIG. 3 is a circuit diagram illustrating an internal configuration of the memory cell array 110 and the plurality of switch circuits 121, 122, 131, and 132 in the memory device 100 according to the embodiment.

As illustrated in FIG. 3, each memory cell MC is connected between the one local word line LWL and the one local bit line LBL.

The memory cell MC includes a memory element 1 and a switching element 2. One end of the memory element 1 is connected to the local bit line LBL. The other end of the memory element 1 is connected to one end of the switching element 2. The other end of the switching element 2 is connected to the local word line LWL.

The memory element 1 is, for example, a variable resistance element. By associating the resistance state of the memory element 1 with data to be stored, the variable resistance element as the memory element 1 can store different data of one bit or more.

The switching element 2 functions as a selector (also referred to as a selection element) of the memory cell MC. The off-state switching element 2 electrically isolates the memory cell MC from the local word line LWL and the local bit line LBL. The on-state switching element 2 supplies a current (or a voltage) to the memory cell MC. For example, the on-state switching element 2 can allow a current flowing from the local bit line LBL to the local word line LWL and a current flowing from the local word line LWL to the local bit line LBL to flow to the memory element 1.

Each local word line LWL (LWL1, LWL2, . . . ) is connected to the corresponding local word line switch LXSW (LXSW1, LXSW2, . . . ). Each local word line LWL includes a capacitive component (wiring capacitance) having a certain magnitude. It is noted that the capacitive components and the wiring capacitance of various wirings (signal lines) include not only the parasitic capacitance of the wiring itself but also the parasitic capacitance of the members (elements and/or circuits) connected to the wirings.

Each local word line switch LXSW has three nodes (terminals). A first node of the local word line switch LXSW is connected to the corresponding local word line LWL. A second node of the local word line switch LXSW is connected to one end of the corresponding global word line GWL. A third node of the local word line switch LXSW is connected to a wiring 700X. A non-select voltage VUSEL is applied to the wiring 700X. The non-select voltage VUSEL is a voltage supplied to the local word lines LWL other than the selected local word line LWL during each operation sequence of the memory device 100.

With respect to the on state and the off state of the local word line switch LXSW, the state in which the first node is electrically connected to the second node is set as the on state of the local word line switch LXSW, and the state in which the first node is electrically connected to the third node (wiring 700X) is set as the off state of the local word line switch LXSW.

In each row switch box XSB, the selected local word line LWL is connected to the global word line GWL via the on-state local word line switch LXSW based on the result of decoding the row address. In each row switch box XSB, the non-selected local word line LWL is connected to the wiring 700X via the local word line switch LXSW based on the result of decoding the row address. Accordingly, the non-select voltage VUSEL is supplied to the non-selected local word lines LWL.

The local word line switch LXSW may be a field effect transistor (for example, a MOS transistor) or may be a MOS switch.

One end of each global word line GWL (GWL1, GWL2, . . . ) is connected to the plurality of local word line switches LXSW of the corresponding row switch box XSB. The other end of each global word line GWL is connected to the corresponding global word line switch GXSW (GXSW1, GXSW2, . . . ). Each global word line GWL includes a capacitive component (wiring capacitance) having a certain magnitude.

A first node of each global word line switch GXSW is connected to a corresponding global word line GWL. A second node of each global word line switch GXSW is connected to the data wiring DXL. The global word line switch GXSW may be a field effect transistor (for example, a MOS transistor) or may be a MOS switch.

The data wiring DXL is a wiring for connecting the row control circuit 120 to the read/write circuit 140. The data wiring DXL includes a capacitive component 9X having a certain magnitude. The capacitive component 9X is provided in the data wiring DXL by the wiring capacitance (parasitic capacitance) of the data wiring DXL and/or a capacitive element 9X connected to the data wiring DXL. It is noted that the capacitive component 9X includes the parasitic capacitance (for example, the parasitic capacitance of the MOS transistor) of the member connected to the data wiring DXL. The reference voltage of the capacitive component 9X is, for example, the non-select voltage VUSEL.

The capacitive component 9X has a capacitance value capable of generating the write current having a desired magnitude.

For example, the capacitive element 9X forming the capacitive component 9X is a metal-oxide-semiconductor (MOS) capacitor or a metal-insulator-metal (MIM) capacitor. These capacitive elements 9X are provided for the data wiring DXL separately from the parasitic capacitance of the data wiring DXL.

It is noted that, in some cases, a total of the capacitive component of the local word line LWL, the capacitive component of the global word line GWL, and the capacitive component of the data wiring DXL may be regarded as the capacitive component 9X.

Each local bit line LBL (LBL1, LBL2, . . . ) is connected to the corresponding local bit line switch LYSW (LYSW1, LYSW2, . . . ). Each local bit line LBL includes a capacitive component (wiring capacitance) having a certain magnitude.

Each local bit line switch LYSW has three nodes (terminals). A first node of the local bit line switch LYSW is connected to the corresponding local bit line LBL. A second node of the local bit line switch LYSW is connected to one end of the corresponding global bit line GBL. A third node of the local bit line switch LYSW is connected to a wiring 700Y. The non-select voltage VUSEL is applied to the wiring 700Y.

With respect to the on state and the off state of the local bit line switch LYSW, the state in which the first node is electrically connected to the second node is set as the on state of the local bit line switch LYSW, and the state in which the first node is electrically connected to the third node (wiring 700Y) is set as the off state of the local bit line switch LYSW.

In each column switch box YSB, the selected local bit line LBL is connected to the global bit line GBL via the on-state local bit line switch LYSW based on the result of decoding the column address. In each column switch box YSB, the non-selected local bit line LBL is connected to the wiring 700Y via the off-state local bit line switch LYSW based on the result of decoding the column address. Accordingly, the non-select voltage VUSEL is supplied to the non-selected local bit lines LBL.

The local bit line switch LYSW may be a field effect transistor (for example, a MOS transistor) or a MOS switch.

One end of each global bit line GBL (GBL1, GBL2, . . . ) is connected to the plurality of local bit line switches LYSW of the corresponding column switch box YSB. The other end of each global bit line GBL is connected to a corresponding global bit line switch GYSW (GYSW1, GYSW2, . . . ). Each global bit line GBL includes a capacitive component (wiring capacitance) having a certain magnitude.

A first node of each global bit line switch GYSW is connected to the corresponding global bit line GBL. A second node of each global bit line switch GYSW is connected to the data wiring DYL. The global bit line switch GYSW may be a field effect transistor (for example, a MOS transistor) or may be a MOS switch.

The data wiring DYL is a wiring for connecting the column control circuit 130 to the read/write circuit 140. The data wiring DYL includes a capacitive component 9Y having a certain magnitude. The capacitive component 9Y is provided in the data wiring DYL by the wiring capacitance (parasitic capacitance) of the data wiring DYL and/or the capacitive element connected to the data wiring DYL. It is noted that the capacitive component 9Y includes the parasitic capacitance of the MOS transistor or circuit connected to the data wiring 9Y, which extends in the Y-direction. The reference voltage of the capacitive component 9Y is, for example, the non-select voltage VUSEL.

The capacitive component 9Y has a capacitance value capable of generating a write current having a desired magnitude.

For example, the capacitive element 9Y forming the capacitive component 9Y is a MOS capacitor or an MIM capacitor. These capacitive elements 9Y are provided for the data wiring DYL separately from the parasitic capacitance.

It is noted that, in some cases, a total of the capacitive component of the local bit line LBL, the capacitive component of the global bit line GBL, and the capacitive component of the data wiring DYL may be regarded as the capacitive component 9Y.

The read/write circuit 140 includes a sense amplifier circuit 141, a precharging circuit (also referred to as a charging circuit or a charge control circuit) 142 (142X and 142Y), and a sink circuit (also referred to as a current lead-in circuit or current absorbing circuit) 143 (143X and 143Y). For example, the sense amplifier circuit 141, a precharging circuit 142X, and a sink circuit 143X are connected to the data wiring DXL.

The sense amplifier circuit 141 is connected to the data wiring DXL via a switch SASW. The sense amplifier circuit 141 can sense a signal (for example, a voltage) from the memory cell MC output to the data wiring DXL and amplify the sensed signal.

The precharging circuit 142X is connected to the data wiring DXL via a switch PCSWX. The precharging circuit 142X precharges the data wiring DXL. The data wiring DXL is charged by precharging with the precharging circuit 142X.

The sink circuit 143X is connected to the data wiring DXL via a switch SKSWX. The sink circuit 143X draws the current flowing through the data wiring DXL.

For example, the precharging circuit 142Y and the sink circuit 143Y are connected to the data wiring DYL.

The precharging circuit 142Y is connected to the data wiring DYL via a switch PCSWY. The precharging circuit 142Y precharges the data wiring DYL. The data wiring DYL is charged by the precharging with the precharging circuit 142Y.

The sink circuit 143Y is connected to the data wiring DYL via a switch SKSWY. The sink circuit 143Y draws the current flowing through the data wiring DYL.

The read/write circuit 140 includes a plurality of sense units (also referred to as read units) SU. Each sense unit SU is connected to the global word line GWL and the data wiring DXL.

Each sense unit SU includes one switch RDSW and two transistors (for example, field effect transistors) TR1 and TR2.

A first node of the switch RDSW is connected to the corresponding global word line GWL. A second node of the switch RDSW is connected to the gate of the transistor TR1. One end of the current path of the transistor TR1 is connected to the data wiring DXL. The other end of the current path of the transistor TR1 is connected to one end of the current path of the transistor TR2. The other end of the current path of the transistor TR2 is connected to a terminal (hereinafter referred to as a ground terminal) to which a ground voltage VGND is applied. The other end of the current path of the transistor TR2 is grounded.

A control signal S1 is supplied to the gate of the transistor TR2. On/off of the transistor TR2 is controlled by the control signal S1.

During a read sequence of a read operation, the transistor TR2 is turned on due to the "H" level control signal S1. Accordingly, the sense unit SU is activated. During a write sequence of a write operation, the transistor TR2 is turned off due to the "L" level control signal S1. Accordingly, the sense unit SU is deactivated.

In the embodiment, during the read sequence, the data wiring DXL is isolated from the global word line GWL by the off-state global word line switch GXSW. During the read sequence, the sense unit SU can sense the potential state of the word line WL according to the current flowing through the memory cell MC. The sense unit SU can reflect the sensed voltage state of the word line WL on the voltage state of the data wiring DXL.

In the embodiment, one circuit or a set of a plurality of circuits other than the memory cell array 110 is also referred to as a peripheral circuit (or a complementary metal-oxide semiconductor (CMOS) circuit).

(Structure of Memory Cell Array)

Figure 4:
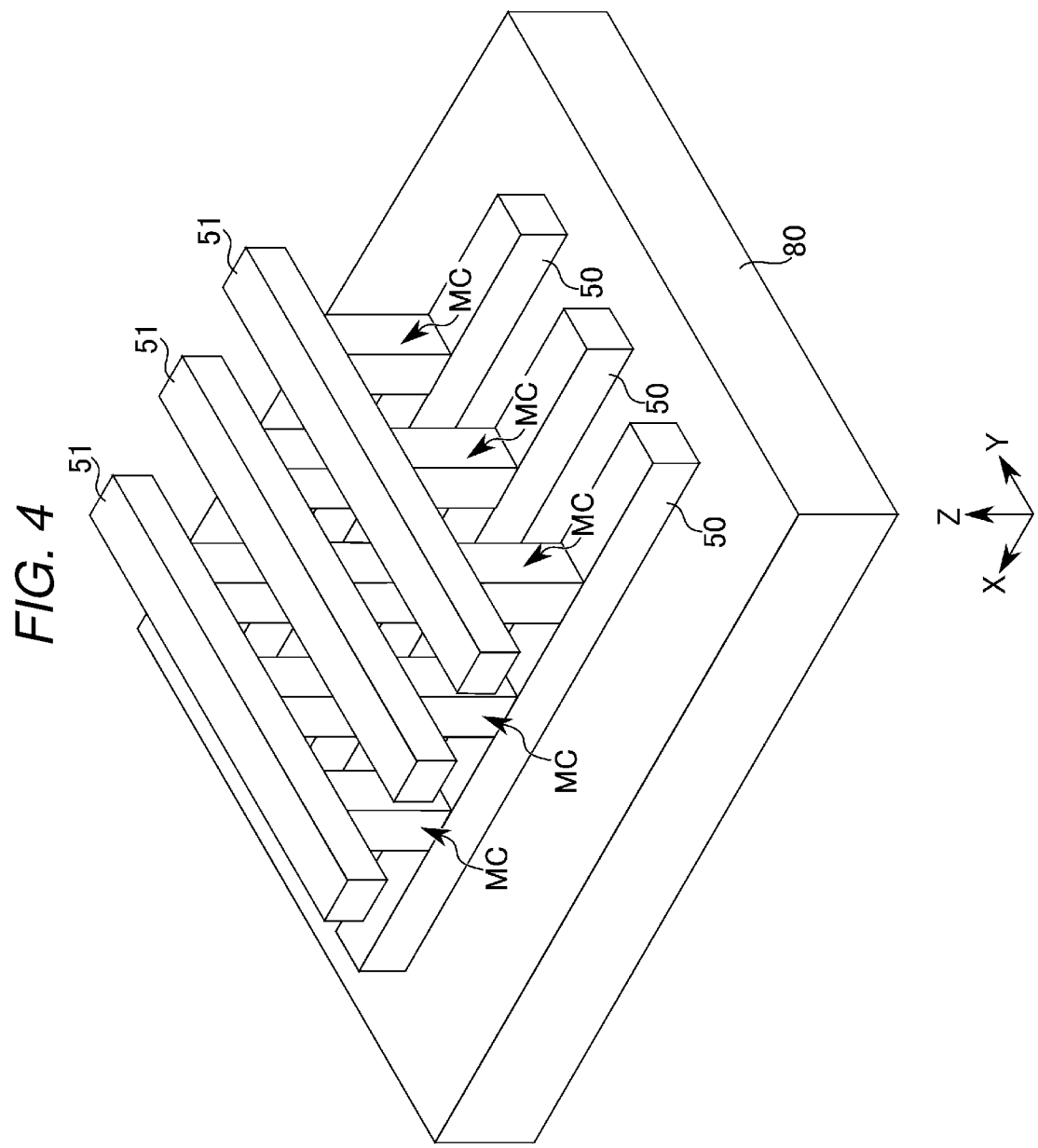
FIG. 4 is a diagram illustrating a structural example of a memory cell array of the memory device according to the first embodiment.
Figure 5:
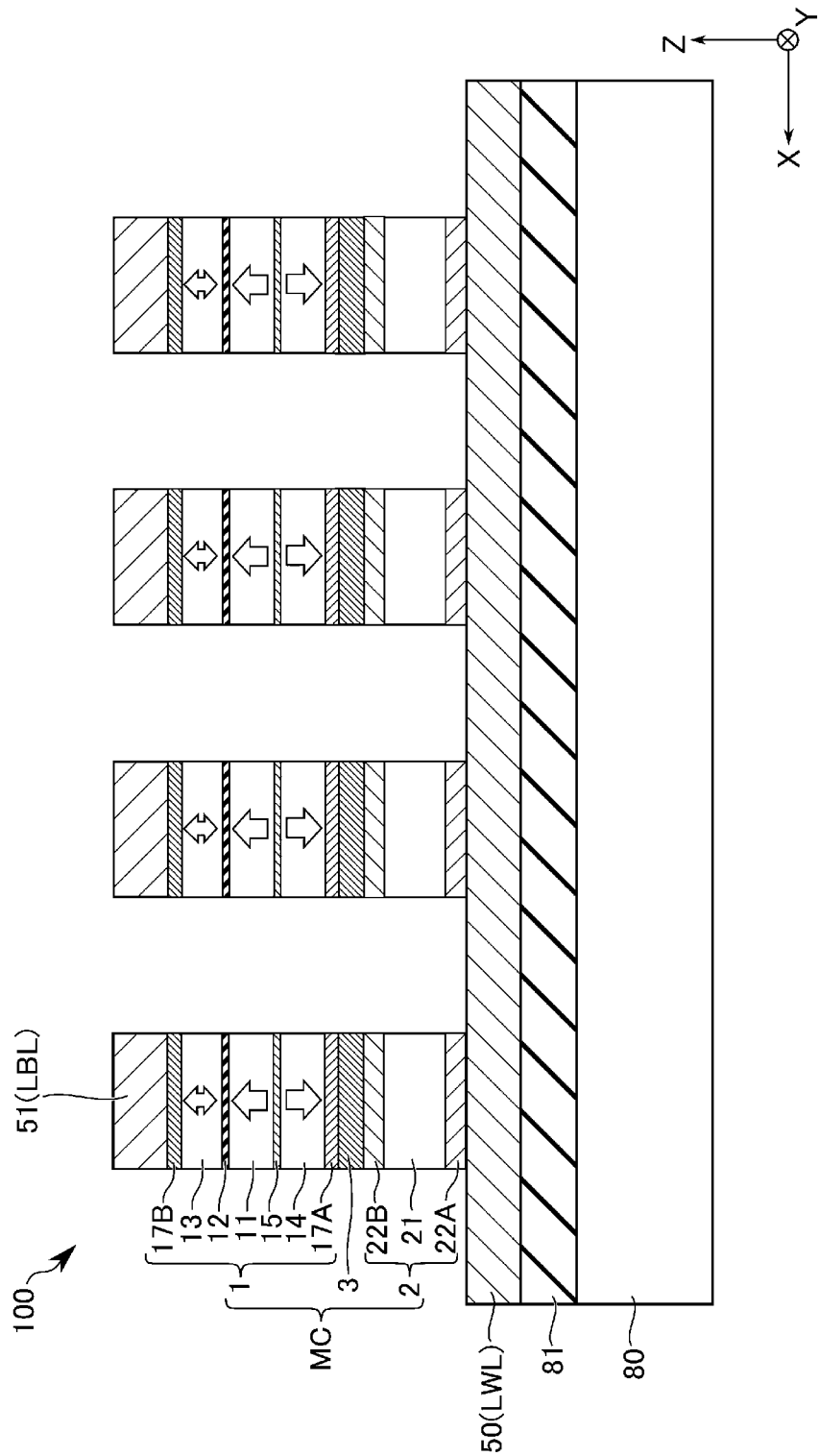
FIGS. 5-6 are each a diagram illustrating a cross-section of the memory cell array of the memory device according to the first embodiment.
Figure 6:
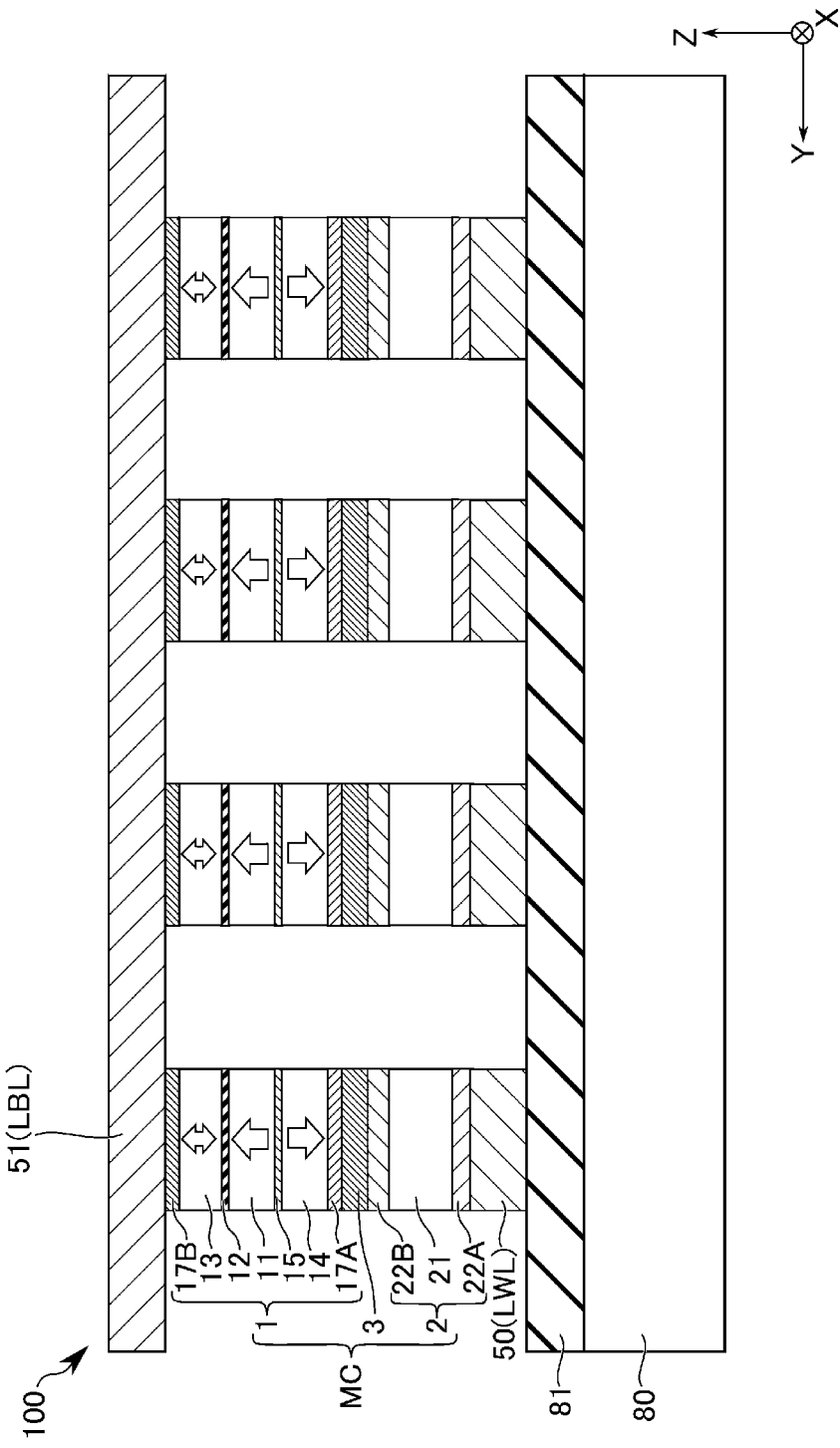

A structural example of the memory cell array 110 in the memory device 100 according to the embodiment will be described with reference to FIGS. 4 to 6. FIGS. 4 to 6 are diagrams illustrating the structural example of the memory cell array 110 of the memory device 100 according to the embodiment. FIG. 4 is a bird's-eye view illustrating the structural example of the memory cell array 110. FIG. 5 is a schematic cross-sectional view illustrating a cross-sectional structure of the memory cell array 110 along the X direction (X axis). FIG. 6 is a schematic cross-sectional view illustrating the cross-sectional structure of the memory cell array 110 along the Y direction (Y-axis).

As illustrated in FIGS. 4 to 6, the memory cell array 110 is provided above an upper surface of a substrate 80.

The X direction is a direction parallel to the upper surface of the substrate 80. The Y direction is a direction parallel to the upper surface of the substrate 80 and intersects the X direction. In the following, the plane parallel to the upper surface of the substrate 80 is referred to as an X-Y plane. The direction (axis) perpendicular to the X-Y plane is set as a Z direction (Z axis). The plane parallel to the plane formed by the X and Z directions is referred to as an X-Z plane. The plane parallel to the plane formed by the Y and Z directions is referred to as a Y-Z plane.

The memory cell array 110 has, for example, a structure in which a plurality of layers are stacked in the Z direction.

A plurality of wirings 50 are provided above the upper surface of the substrate 80 via an insulating layer 81 on the substrate 80 in the Z direction. The plurality of wirings 50 are arranged in the Y direction. Each wiring 50 extends along the X direction. Each of the plurality of wirings 50 functions, for example, as local word lines LWL.

A plurality of wirings 51 are provided above the plurality of wirings 50 in the Z direction. The plurality of wirings 51 are arranged in the X direction. Each wiring 51 extends along the Y direction. Each of the plurality of wirings 51 functions as, for example, a local bit line LBL.

The plurality of memory cells MC are provided between the plurality of wirings 50 and the plurality of wirings 51. The plurality of memory cells MC are arranged in a matrix configuration in the X-Y plane.

The plurality of memory cells MC arranged in the X direction are provided on one wiring 50 in the Z direction. The plurality of memory cells MC arranged in the X direction are connected to a common word line WL. The plurality of memory cells MC arranged in the Y direction are provided under the one wiring 51 in the Z direction. The plurality of memory cells MC arranged in the Y direction are connected to a common bit line BL.

The memory cell array 110 is covered with an insulating layer (not illustrated). For example, insulating layers are provided in spaces between the memory cells MC, in spaces between the wirings 50, and in spaces between the wirings 51.

When the memory cell array 110 has a circuit configuration of FIG. 3, the switching element 2 is provided below the memory element 1 in the Z direction. The switching element 2 is provided between the memory element 1 and the wiring 50. The memory element 1 is provided between the wiring 51 and the switching element 2.

Thus, in the stacked memory cell array 110, each memory cell MC is a stacked body of the memory element 1 and the switching element 2.

FIGS. 5 and 6 illustrate an example in which the insulating layer 81 is provided between the plurality of wirings 50 and the substrate 80. When the substrate 80 is a semiconductor substrate, one or more field effect transistors (not illustrated) may be provided on a semiconductor region on the upper surface of the substrate 80. The field effect transistor is covered with the insulating layer 81. The field effect transistor on the substrate 80 is an element of a peripheral circuit PERI in the memory device 100. Thus, a circuit for controlling the operation of the memory cell array 110 may be provided below the memory cell array 110 in the Z direction. It is noted that, when the substrate 80 is an insulating substrate, the plurality of wirings 50 may be directly provided on the upper surface of the substrate 80 without the insulating layer 81.

The circuit configuration and structure of the stacked memory cell array 110 are not limited to the example illustrated in FIGS. 4 to 6. The circuit configuration and structure of the memory cell array 110 can be appropriately modified according to the connection relationship of the memory elements 1 and the switching elements 2 with respect to the bit lines BL and the word lines WL.

(Structure of Memory Cell)

An internal structure of the memory cell MC will be described with reference to FIGS. 5 and 6. The switching element 2 has the following configuration. As illustrated in FIGS. 5 and 6, the switching element 2 includes at least a variable resistance layer (also referred to as a selector layer or switch layer) 21 and two electrodes 22 (22A and 22B). The variable resistance layer 21 is provided between the two electrodes 22A and 22B in the Z direction.

In the example of FIGS. 5 and 6, the electrode (hereinafter also referred to as a lower electrode) 22A is provided under the variable resistance layer 21 in the Z direction, and the electrode (hereinafter also referred to as an upper electrode) 22B is provided on the variable resistance layer 21 in the Z direction. For example, the electrode 22A is provided between the wiring 50 and the variable resistance layer 21. The electrode 22B is provided between the variable resistance layer 21 and the memory element 1.

The switching element 2 is connected to the wiring 50 via the electrode 22A. The switching element 2 is connected to the memory element 1 via the electrode 22B.

The resistance state (resistance value) of the variable resistance layer 21 is changed. The variable resistance layer 21 may have a plurality of resistance states.

According to the voltage applied to the switching element 2, the resistance state of the variable resistance layer 21 enters a high resistance state (which is a non-conducting state) or a low resistance state (which is a conducting state). When the resistance state of the variable resistance layer 21 is the high resistance state, the switching element 2 is in the off state. When the resistance state of the variable resistance layer 21 is the low resistance state, the switching element 2 is in the on state.

When the memory cell MC is set to the selected state, the switching element 2 is turned on, so that the resistance state of the variable resistance layer 21 enters the low resistance state. In this case, the switching element 2 supplies a current (or a voltage) to the memory element 1. When the memory cell MC is set to the non-selected state, the switching element 2 is turned off, so that the resistance state of the variable resistance layer 21 enters the high resistance state. In this case, the switching element 2 cuts off the supply of a current (or a voltage) to the memory element 1.

It is noted that, in some cases, according to the material of the variable resistance layer 21, the change in the resistance state of the variable resistance layer 21 may depend on the current (for example, the magnitude of the current) flowing through the switching element 2.

With respect to the switching element 2 and the variable resistance layer 21, a switching element having characteristics in which the resistance value of the variable resistance layer 21 at a certain voltage value is sharply decreased, an applied voltage is sharply decreased according to the sharp decrease in the resistance value, and thus, a current is increased. Such an effect referred to as snapback is described as an example. It is noted that the materials used for the switching elements having such characteristics are appropriately selected and used according to the characteristics of the memory cells.

The switching element 2 may include, for example, an insulator containing dopants (more generally, impurities) in the variable resistance layer 21. The dopant added to the insulator is an impurity contributing to electrical conduction in the insulator. An example of the insulator used for the variable resistance layer 21 of the switching element 2 is silicon oxide. When the material of the variable resistance layer 21 is silicon oxide, for example, phosphorus or arsenic is used as a dopant added to the silicon oxide. However, the type of dopant added to the silicon oxide of the variable resistance layer 21 is not limited to the above examples.

The memory element 1 has the following configuration. When the memory device 100 is a magnetoresistive random access memory (MRAM), the memory element 1 is a magnetoresistance effect element 1.

As illustrated in FIGS. 5 and 6, the magnetoresistance effect element 1 includes two magnetic layers 11 and 13 and a non-magnetic layer 12. The non-magnetic layer 12 is provided between the two magnetic layers 11 and 13 in the Z direction. In the example of FIGS. 5 and 6, a plurality of the layers 11, 12, and 13 are arranged from the wiring (for example, local word line LWL) 50 side toward the wiring (for example, local bit line LBL) 51 side in order of the magnetic layer 11, the non-magnetic layer 12, and the magnetic layer 13 in the Z direction.

The two magnetic layers 11 and 13 and the non-magnetic layer 12 constitute a magnetic tunnel junction. In the following, the magnetoresistance effect element 1 including the magnetic tunnel junction is referred to as a magnetic tunnel junction (MTL) element 1. The non-magnetic layer 12 in the MTJ element 1 is referred to as a tunnel barrier layer.

Each of the magnetic layers 11 and 13 is, for example, a ferromagnetic layer containing at least one element among cobalt (Co), iron (Fe), and nickel (Ni). In addition, the magnetic layers 11 and 13 may further contain boron (B). More specifically, for example, the magnetic layers 11 and 13 contain cobalt iron boron (CoFeB) or iron boride (FeB). The magnetic layers 11 and 13 may be single layer films (for example, alloy films) or multilayer films (for example, artificial lattice films).

The tunnel barrier layer 12 is, for example, an insulating layer containing oxygen (O) and magnesium (Mg). More specifically, for example, the tunnel barrier layer 12 is a magnesium oxide layer. The tunnel barrier layer 12 may be a single layer film or may be a multilayer film. It is noted that the tunnel barrier layer 12 may further contain elements other than oxygen and magnesium.

In the embodiment, the MTJ element 1 is a perpendicular magnetization type magnetoresistance effect element. For example, each of the magnetic layers 11 and 13 has a perpendicular magnetic anisotropy. Each of the magnetic layers 11 and 13 has magnetization perpendicular to the layer planes of the magnetic layers 11 and 13.

Among the two magnetic layers 11 and 13, one magnetic layer has a variable magnetization direction, and the other magnetic layer has an invariable magnetization direction. The MTJ element 1 may have a plurality of resistance states (resistance values) according to the relative relationship (magnetization arrangement) between the magnetization direction of one magnetic layer and the magnetization direction of the other magnetic layer.

In the examples of FIGS. 5 and 6, the magnetization direction of the magnetic layer 13 is variable. The magnetization direction of the magnetic layer 11 is invariable (and thus in a fixed state). The magnetic layer 13 having a magnetization direction that is variable is hereinafter referred to as a storage layer. The magnetic layer 11 having a magnetization direction that is invariable is hereinafter referred to as a reference layer. It is noted that, in some cases, the storage layer 13 may also be referred to as a free layer, a magnetization free layer, or a magnetization variable layer. A reference layer 11 may also be referred to as a pin layer, a pinned layer, a magnetization invariable layer, or a magnetization fixed layer.

In the embodiment, "the magnetization direction of the reference layer is invariable" or "the magnetization direction of the reference layer is in a fixed state" means that, when a current (or a voltage) for changing the magnetization direction of the storage layer 13 is supplied to the MTJ element 1, the magnetization direction of the reference layer 11 is not changed before and after the supply of the current (or the voltage).

When the magnetization direction of the storage layer 13 is the same as the magnetization direction of the reference layer 11 (when the magnetization arrangement state of the MTJ element 1 is in a parallel arrangement state), the resistance state of the MTJ element 1 is a first resistance state. When the magnetization direction of the storage layer 13 is different from the magnetization direction of the reference layer 11 (when the magnetization arrangement state of the MTJ element 1 is the antiparallel arrangement state), the resistance state of the MTJ element 1 is a second resistance state different from the first resistance state. For example, the resistance value of the MTJ element 1 in the second resistance state (antiparallel arrangement state) is higher than the resistance value of the MTJ element 1 in the first resistance state (parallel arrangement state).

In the following, with respect to the magnetization arrangement state of the MTJ element 1, the parallel arrangement state is also denoted by a parallel (P) state, and the antiparallel arrangement state is also denoted by an anti-parallel (AP) state.

It is noted that there is a case where, according to the circuit configuration of the memory cell array 110, the reference layer may be provided above the tunnel barrier layer 12 in the Z direction, and the storage layer may be provided below the tunnel barrier layer 12 in the Z direction.

For example, the MTJ element 1 includes conductive layers 17A and 17B, which are electrodes. The magnetic layers 11 and 13 and the tunnel barrier layer 12 are provided between the two conductive layers 17A and 17B in the Z direction.

For example, a shift cancellation layer 14 may be provided in the MTJ element 1. In this case, the shift cancellation layer 14 is provided between the reference layer 11 and the conductive layer 17A. The shift cancellation layer 14 is a magnetic layer for alleviating the influence of a leakage magnetic field of the reference layer 11. When the MTJ element 1 includes the shift cancellation layer 14, a non-magnetic layer 15 is provided between the shift cancellation layer 14 and the reference layer 11. The non-magnetic layer 15 is, for example, a metal layer such as a ruthenium layer. The shift cancellation layer 14 is antiferromagnetically coupled to the reference layer 11 via the non-magnetic layer 15. Accordingly, the stacked body including the reference layer 11 and the shift cancellation layer 14 forms a synthetic antiferromagnetic (SAF) structure. In the SAF structure, the magnetization direction of the shift cancellation layer 14 is opposite to the magnetization direction of the reference layer 11. Due to the SAF structure, the magnetization direction of the reference layer 11 can be more stably fixed. It is noted that, in some cases, a set including the two magnetic layers 11 and 14 and the non-magnetic layer 15 forming the SAF structure is referred to as a reference layer.

For example, a non-magnetic layer (not illustrated) referred to as an underlayer may be provided between the shift cancellation layer 14 and the conductive layer 17A. The underlayer is a layer for improving the characteristics (for example, crystallinity and magnetic characteristics) of the magnetic layer (herein, the shift cancellation layer 14) in contact with the underlayer. For example, a non-magnetic layer (not illustrated) referred to as a cap layer may be provided between the storage layer 13 and the conductive layer 17B. The cap layer is a layer for improving the characteristics (for example, crystallinity and magnetic characteristics) of the magnetic layer (herein, the storage layer 13) in contact with the cap layer.

A conductor 3 is provided between the MTJ element 1 and the switching element 2 in the Z direction. The conductor 3 electrically connects the MTJ element 1 to the switching element 2. The electrode 17A may be one layer continuous with the conductor 3. The electrode 22B may be one layer continuous with the conductor 3. The conductor 3 and the electrodes 17A and 22B may be one continuous layer. In the following, the conductor 3 is also referred to as an intermediate electrode 3 or an intermediate layer 3.

(Characteristics of Memory Cell)

Figure 7:
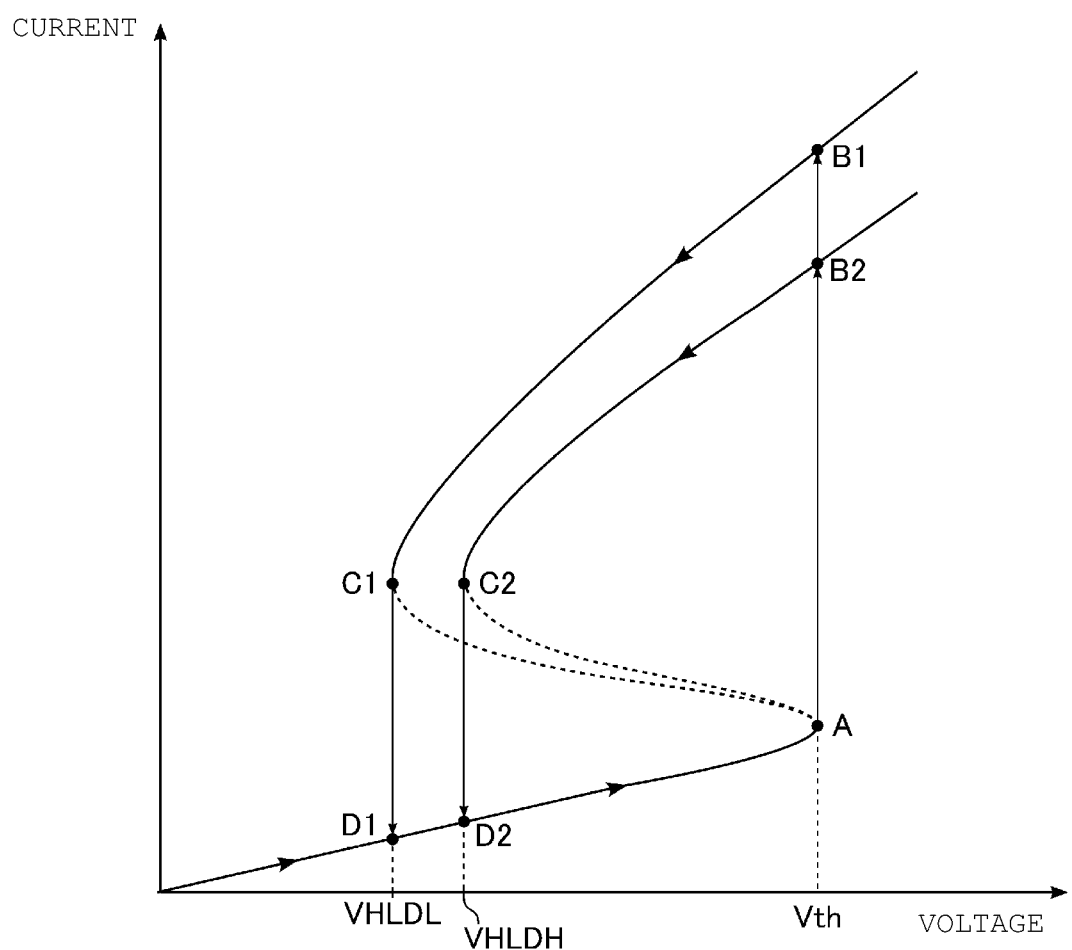
FIG. 7 is a diagram illustrating characteristics of memory cells of the memory device according to the first embodiment.

The characteristics of the memory cell MC in the memory device 100 according to the embodiment will be described with reference to FIG. 7. FIG. 7 is a graph illustrating voltage-current characteristics of the memory cell MC in the memory device 100 according to the embodiment. The horizontal axis of the graph indicates the magnitude of the inter-terminal voltage (hereinafter also referred to as a cell voltage) of the memory cell MC. The vertical axis of the graph indicates the magnitude of the current flowing through the memory cell MC (hereinafter also referred to as a cell current) on a logarithmic scale. In FIG. 7, virtual characteristics that are not actual are indicated by broken lines.

FIG. 7 illustrates the characteristics of the memory cell MC in the low resistance state and the characteristics of the memory cell MC in the high resistance state.

As the voltage is increased from 0, the current continues to be increased until a voltage Vth is reached. The switching element 2 of the memory cell MC remains off until the voltage reaches the threshold voltage Vth of the switching element 2.

When the voltage is further increased and reaches the threshold voltage Vth at a point A, the relationship between the voltage and the current exhibits a discontinuous change, as illustrated at points B1 and B2.

The magnitude of the current at the points B1 and B2 is significantly larger than the magnitude of the current at the point A. This rapid change in current is based on the switching element 2 of the memory cell MC being turned on. The magnitude of the currents at the points B1 and B2 depends on the resistance state of the MTJ element 1 of the memory cell MC.

In a state where the switching element 2 is turned on, for example, when the voltage is reduced from a state where the voltage and current exhibit the relationship illustrated at the point B1 or the point B2, the current continues to be decreased.

When the voltage is further reduced and reaches a certain magnitude, the relationship between the voltage and the current exhibit a discontinuous change. The voltage at which the relationship between the voltage and the current begins to exhibit discontinuity depends on the voltage between the terminals of the MTJ element 1 of the memory cell MC. The voltage at which discontinuity begins to be exhibited depends on whether the resistance state of the MTJ element 1 is in the high resistance state or the low resistance state.

For example, when the resistance state of the MTJ element 1 is in the low resistance state, the voltage-current characteristics are changed along the path from the point B1 to a point C1. For example, when the resistance state of the MTJ element 1 is the high resistance state, the voltage-current characteristics change along the path from the point B2 to a point C2.

When the resistance state of the MTJ element 1 is the low resistance state, the relationship between the voltage and the current exhibits discontinuity from the point C1. When the resistance state of the MTJ element 1 is the high resistance state, the relationship between the voltage and the current exhibits discontinuity from the point C2. When reaching the points C1 and C2, the relationship between the voltage and the current exhibits the characteristics illustrated at points D1 and D2, respectively. The current magnitudes at the points D1 and D2 are significantly smaller than the current magnitudes at the points C1 and C2, respectively. This rapid change in current is based on the switching element 2 of the memory cell MC being turned off.

The cell voltage at the point D1 of the memory cell MC including the MTJ element 1 in the low resistance state is referred to as a low hold voltage VHLDL. The cell voltage at the point D2 of the memory cell MC including the MTJ element 1 in the high resistance state is referred to as a high hold voltage VHLDH.

The magnitude of the high hold voltage VHLDH of each of the plurality of memory cells MC may differ due to unintended variations in the characteristics of the memory cells MC. The magnitude of the low hold voltage VHLDL of each of the plurality of memory cells MC may differ due to unintended variations in the characteristics of the memory cells MC.

Thus, a hold voltage VHLD (VHLDL and VHLDH) having different magnitudes is obtained according to the resistance state of the MTJ element 1 in the memory cell MC.

The data stored in the memory cell MC is determined by using the difference in the magnitudes of the hold voltages VHLD.

The memory device 100 according to the embodiment writes data to the memory cell MC by using a current generated due to charging and discharging of the capacitive component 9 of the data wiring DXL and the data wiring DYL as a write current.

Accordingly, the memory device 100 according to the embodiment can improve the operating characteristics of the memory device 100.

(b) Operation Example

An operation example of the memory device 100 according to the embodiment will be described with reference to FIGS. 8A to 15.

(b-1) Read Sequence

The read sequence of the memory device 100 according to the embodiment will be described with reference to FIGS. 8A to 11. FIGS. 8A to 8C are timing charts of the read sequence of the memory device 100 according to the embodiment. In FIGS. 8A to 8C, the horizontal axis of the graph indicates time. In FIG. 8A, the vertical axis of the graph indicates voltage. In FIG. 8B, the vertical axis of the graph indicates current. In FIG. 8C, the vertical axis of the graph indicates a signal level of the control signal for each element.

Figure 9:
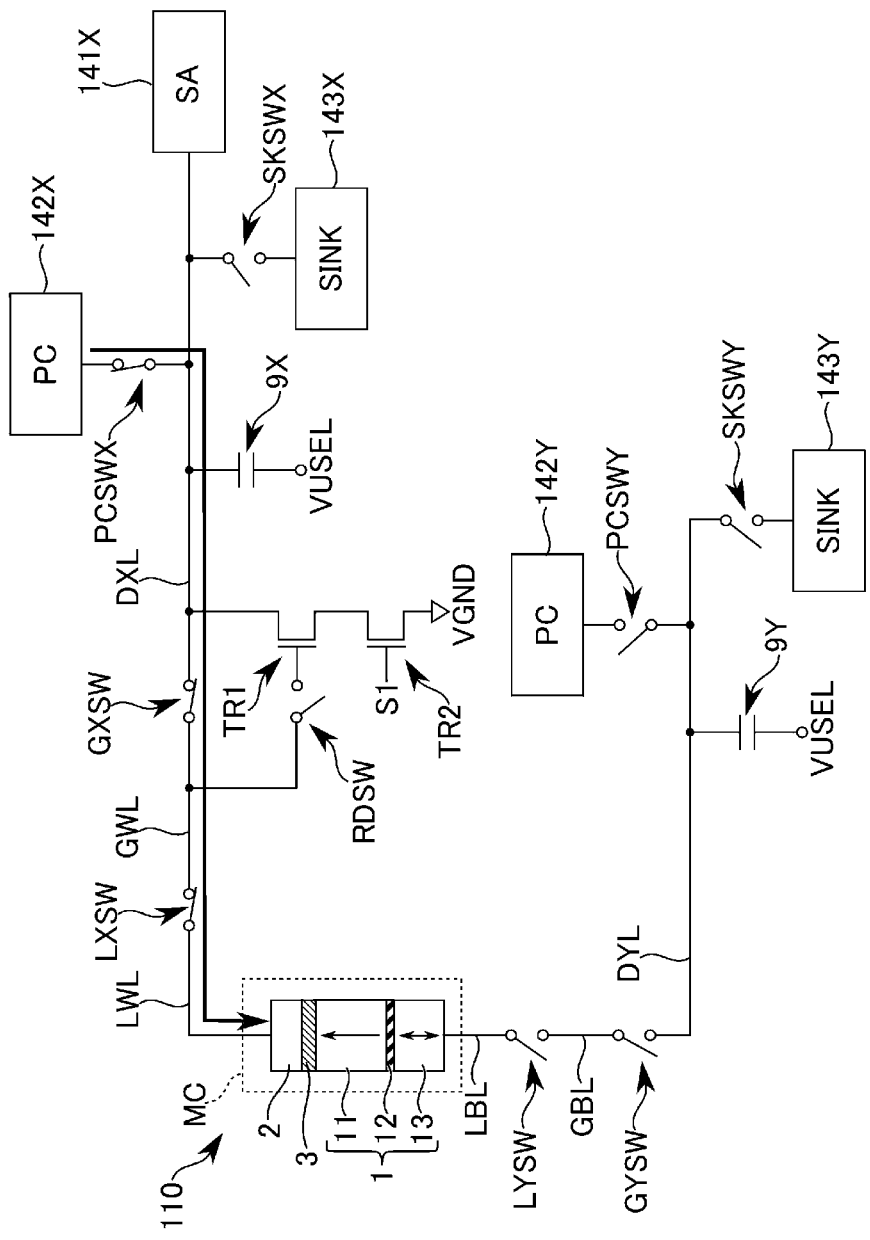
FIGS. 9-11 are schematic block diagrams illustrating a read operation example of the memory device according to the first embodiment.
Figure 10:
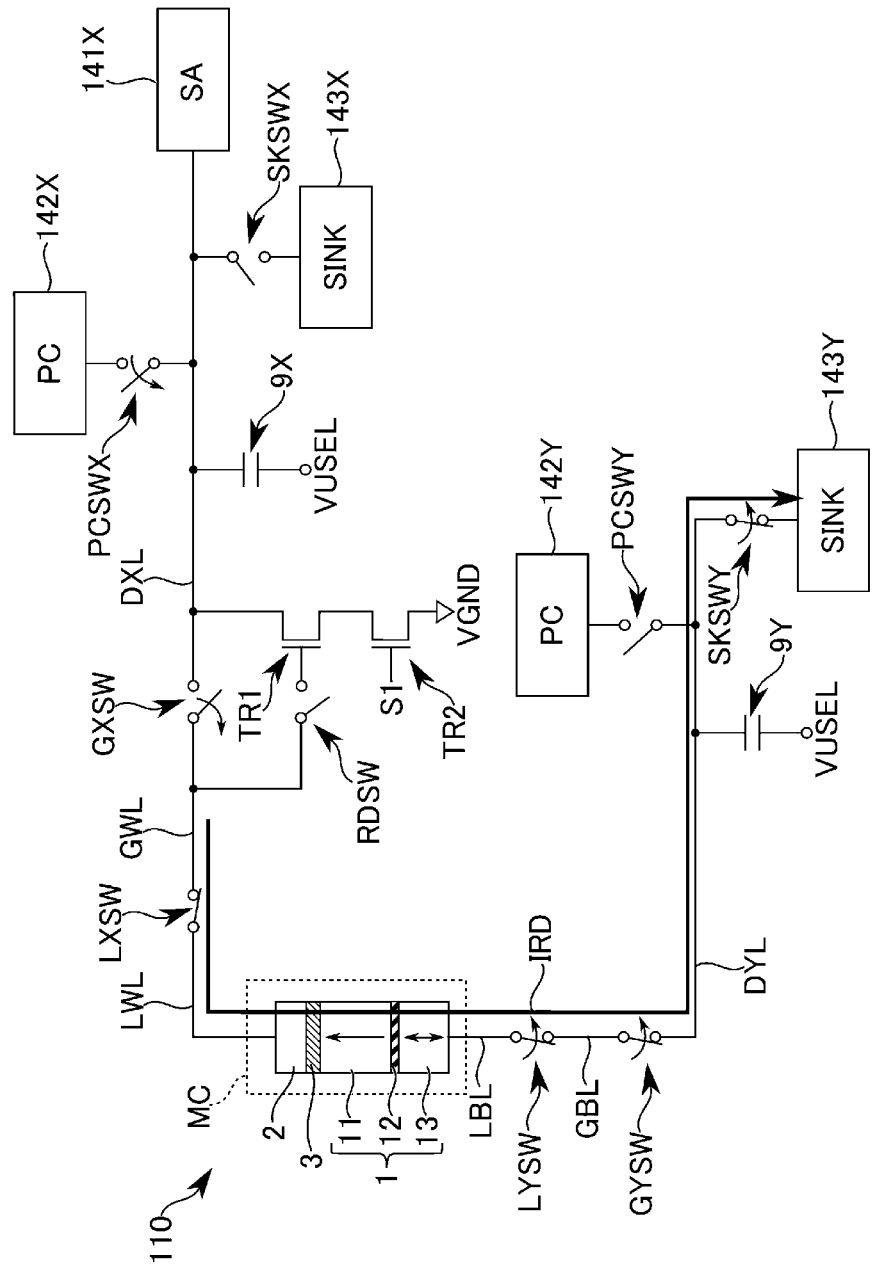
Figure 11:
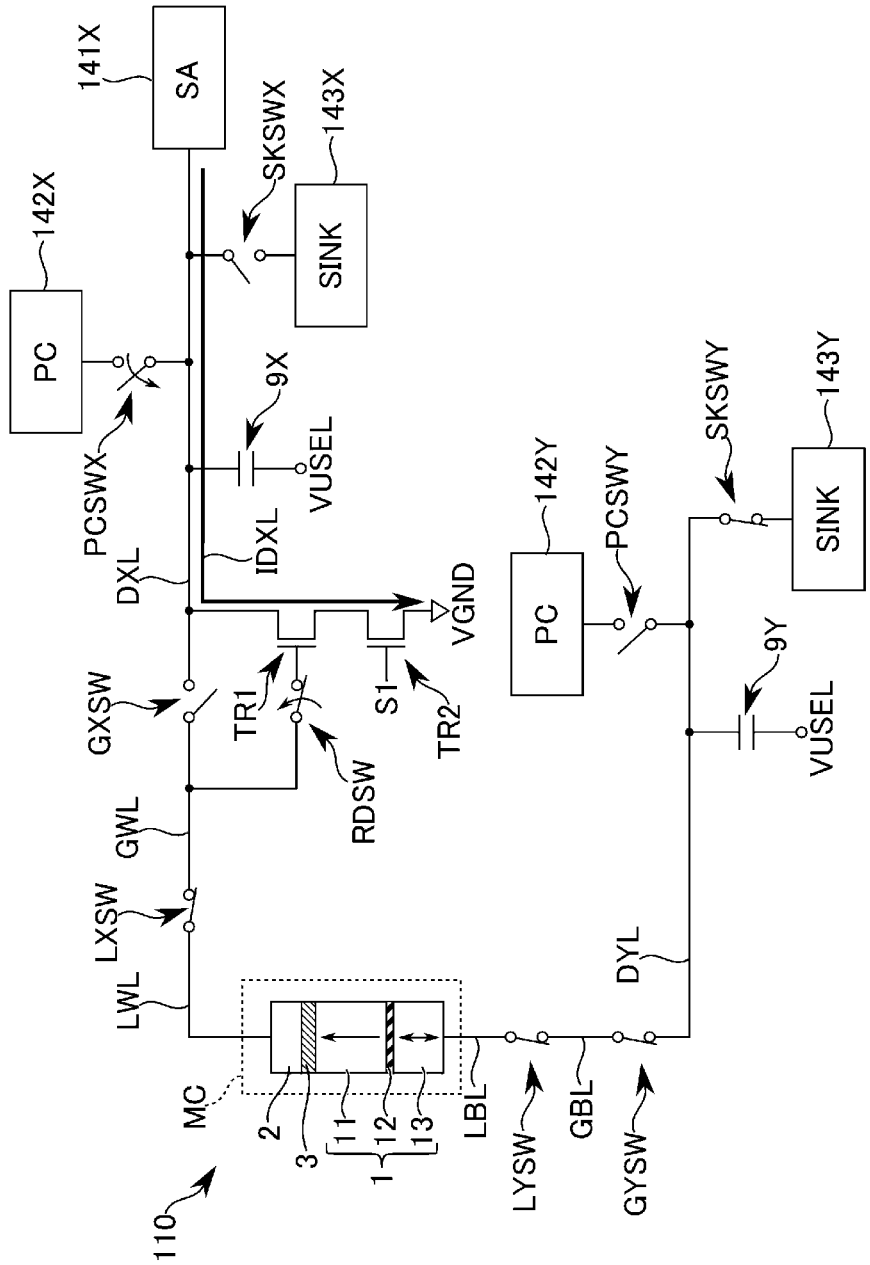

Each of FIGS. 9, 10 and 11 is a diagram schematically illustrating a connection state between the elements during the read sequence in the memory device 100 according to the embodiment. It is noted that, in FIGS. 9 to 11, illustration of the elements (for example, the non-selected memory cells MC, word lines WL, and bit lines BL) that do not contribute to the operation is omitted.

<Time t0>

As illustrated in FIGS. 8A to 8C, at time t0, before the start of the operation sequence of the memory device 100, the non-select voltage VUSEL is applied to each of the data wiring DXL, the data wiring DYL, the word lines WL (the local word line LWL and the global word line GWL), and the bit lines BL (the local bit lines LBL and the global bit lines GBL).

<Times t1, t2, and t3>

The memory device 100 receives the command CMD and the address ADR from the external device 900. The command CMD and the address ADR are transferred from input/output circuit 170 to the sequencer 190.

The sequencer 190 decodes the command CMD and the address ADR. The sequencer 190 starts the read sequence based on the result of decoding the command CMD. The sequencer 190 transmits the result of decoding the address ADR to the row control circuit 120 and the column control circuit 130.

The row control circuit 120 controls the rows of memory cell array 110 based on the result of decoding the address ADR. The column control circuit 130 controls the columns of memory cell array 110 based on the result of decoding the address ADR.

The memory cell MC corresponding to the address ADR is selected as an operation target of the read sequence. In the following, the memory cell MC selected as an operation target based on the address ADR is referred to as a selected cell.

The read/write circuit 140 starts the operations for the read sequences under the control of the sequencer 190.

At time t1, the row control circuit 120 changes the signal level of the control signal for the local word line switch LXSW corresponding to the address ADR from the "L" level to the "H" level. The local word line switch LXSW corresponding to the address ADR is turned on due to the "H" level signal.

Accordingly, as illustrated in FIG. 9, the corresponding local word line (selected local word line) LWL is electrically connected to the global word line GWL via the on-state local word line switch LXSW.

It is noted that the local word line switch LXSW corresponding to the non-selected local word line LWL is set to the off state due to the "L" level control signal. Accordingly, in the read sequence, the non-select voltage VUSEL is applied to the non-selected local word lines LWL.

The row control circuit 120 changes the signal level of the control signal for the global word line switch GXSW corresponding to the address ADR from the "L" level to the "H" level. The global word line switch GXSW corresponding to the address ADR is turned on due to the "H" level signal.

Accordingly, the corresponding global word line (selected global word line) GWL is electrically connected to the data wiring DXL via the on-state global word line switch GXSW.

For example, the non-select voltage VUSEL is applied to the non-selected global word lines GWL. The non-selected global word lines GWL may be in an electrically floating state.

The column control circuit 130 sets the local bit line switch LYSW and the global bit line switch GYSW corresponding to the address ADR to the off state due to the "L" level control signal. The local bit line LBL and the global bit line GBL corresponding to the address ADR are electrically isolated from the data wiring DYL and the read/write circuit 140.

At time t2, the sequencer 190 changes the signal level of the control signal for the switch PCSWX from the "L" level to the "H" level. The switch PCSWX is turned on due to the "H" level signal. Accordingly, the precharging circuit 142X on the word line WL side is electrically connected to the data wiring DXL via the on-state switch PCSWX. The precharging circuit 142X charges the data wiring DXL and the selected word line WL.

At time t3, the voltage of the data wiring DXL and the voltage of the selected word line WL reach a precharge voltage VPRC having a certain voltage value. The voltage value of the precharge voltage VPRC depends on the voltage supplied by the precharging circuit 142X.

The precharging circuit 142Y on the bit line BL side is electrically isolated from the data wiring DYL by the off-state switch PCSWY.

<Times t4 and t5>

At time t4, the sequencer 190 changes the signal level of the control signal for the switch PCSWX from the "H" level to the "L" level.

Accordingly, as illustrated in FIG. 10, the switch PCSWX is turned off. The precharging circuit 142X is electrically isolated from the data wiring DXL. The precharging circuit 142X is deactivated. Thus, the precharging of the selected word line WL and the data wiring DXL is completed.

At time t5, the row control circuit 120 changes the signal level of the control signal for the global word line switch GXSW corresponding to the address ADR from the "H" level to the "L" level. The global word line switch GXSW is turned off due to the "L" level signal. Accordingly, the data wiring DXL is electrically isolated from the selected word line WL including the selected global word line GWL and the selected local word line LWL by the off-state global word line switch GXSW.

<Times t6, t7, t8 and t9>

After the global word line switch GXSW corresponding to the selected word line WL is set to the off state, the selected bit line BL (the local bit line LBL and the global bit line GBL) corresponding to the address ADR is activated.

At time t6, the column control circuit 130 changes the signal level of the control signal for the local bit line switch LYSW corresponding to the address ADR from the "L" level to the "H" level. The local bit line switch LYSW is turned on due to the "H" level signal.

Accordingly, as illustrated in FIG. 10, the corresponding local bit line (selected local bit line) LBL is electrically connected to the global bit line GBL via the on-state local bit line switch LYSW.

The column control circuit 130 changes the signal level of the control signal for the global bit line switch GYSW corresponding to the address ADR from the "L" level to the "H" level. The global bit line switch GYSW is turned on due to the "H" level signal.

Accordingly, the corresponding global bit line (selected global bit line) GBL is electrically connected to the data wiring DYL via the on-state global bit line switch GYSW.

At time t6, the sequencer 190 changes the signal level of the control signal for the switch SKSWY from the "L" level to the "H" level. The switch SKSWY is turned on due to the "H" level signal. Accordingly, the sink circuit 143Y on the bit line BL side is electrically connected to the data wiring DYL via the on-state switch SKSWY. The sink circuit 143Y draws a current.

The switch SKSWY may be set to the on state at a timing before the global bit line GBL is electrically connected to the data wiring DYL.

It is noted that the sink circuit 143X on the word line WL side is electrically isolated from the data wiring DXL by the off-state switch SKSWX.

As illustrated in FIGS. 8A to 8C, the selected bit line BL is discharged by the activated sink circuit 143Y in a state where the selected global word line GWL is electrically isolated from the data wiring DXL. The voltage of the selected bit line BL is decreased from the non-select voltage VUSEL. At this time, the selected word line WL is electrically isolated from the selected bit line BL and the data wiring DYL by the selected cell MC including the off-state switching element 2. Therefore, when the switching element 2 is in the off state, the voltage of the selected word line WL is not changed even though the selected bit line BL is electrically connected to the sink circuit 143Y.

At certain time t7, the voltage difference between the selected word line WL and the selected bit line BL (corresponding to the cell voltage of the memory cell MC) reaches the threshold voltage Vth of the switching element 2 as the voltage of the selected bit line BL is decreased. Accordingly, the switching element 2 in the selected cell MC is turned on. The selected cell MC including the on-state switching element 2 is activated.

The selected word line WL is electrically connected to the selected bit line BL via the on-state switching element 2 in the selected cell MC. The sink circuit 143Y is electrically connected to the selected word line WL. Accordingly, the selected word line WL is discharging. A discharge current IRD is generated due to the discharging of the selected word line WL. The generated discharge current IRD is the read current IRD.

As a result, as illustrated in FIG. 10, the read current IRD flows from the selected word line WL toward the selected bit line BL.

For example, at time t8, the voltage of the selected bit line BL reaches a certain voltage (for example, a ground voltage VGND).

As described above, the selected word line WL is electrically isolated from a voltage supply source such as the precharging circuit 142X by the off-state global word line switch GXSW. Therefore, the voltage of the selected word line WL is decreased with the elapse of time due to the discharge by the read current IRD. For example, the voltage of the selected word line WL becomes lower than the non-select voltage VUSEL.

The data wiring DXL is electrically isolated from the selected word line WL by the off-state global word line switch GXSW. Therefore, at time t8, the voltage of the data wiring DXL is maintained at approximately the precharge voltage VPRC.

In the read sequence, the data wiring DXL is electrically isolated from the global word line GWL by the off-state switch GXSW. Therefore, the charges charged in the data wiring DXL do not act on the read current IRD. The magnitude of the read current IRD depends on the amount of charges charged in the global word line GWL and the local word line LWL. The current value of the read current IRD is smaller than the current value of the discharge current (for example, the write current) depending on the amount of charges charged in the data wiring DXL, the global word line GWL, and the local word line LWL. Along with this, the supply period of the read current IRD depending on the amount of charges charged in the global word line GWL and the local word line LWL is shorter than the supply period of the discharge current depending on the amount of charges charged in the data wiring DXL, the global word line GWL, and the local word line LWL.

As a result, during the read sequence, the magnitude of the current IRD flowing through the selected cell MC is reduced without becoming excessively large. As a result, the occurrence of read disturbance is prevented.

Along with the decrease in the voltages of the selected word line WL and the selected bit line BL, the cell voltage of the memory cell MC is gradually decreased.

When the cell voltage of the memory cell MC becomes lower than the threshold voltage Vth of the switching element 2, the switching element 2 is turned off. The selected word line WL is electrically isolated from the bit line BL by the off-state switching element 2.

The current IRD is automatically stopped according to the turning off of the switching element 2.

As a result, the discharging of the selected word line WL is stopped at certain time t9. The voltage of the selected word line WL is set to a voltage having a certain magnitude.

A hold voltage VHLD (VHLDH and VHLDL) is generated as a voltage difference between the selected word line WL and the bit line BL. As described above, the magnitude of the hold voltage VHLD differs according to the resistance state of the MTJ element 1.

When the resistance state of the MTJ element 1 is the high resistance state, the high hold voltage VHLDH is generated between the selected word line WL and the selected bit line BL.

When the resistance state of the MTJ element 1 is the low resistance state, the low hold voltage VHLDL is generated between the selected word line WL and the selected bit line BL. The low hold voltage VHLDL is lower than the high hold voltage VHLDH.

<Times t10, t11, and t12>

At time t10, in a state where the hold voltage VHLD is retained between the selected word line WL and the selected bit line BL, the sequencer 190 changes the signal level of the control signal for the switch RDSW in the sense unit SU corresponding to the address ADR from the "L" level to the "H" level.

Accordingly, as illustrated in FIG. 11, the gate of the transistor TR1 of the sense unit SU is electrically connected to the selected global word line GWL via the on-state switch RDSW. The voltage of the selected word line WL is applied to the gate of the transistor TR2.

The sequencer 190 changes the signal level of the control signal S1 from the "L" level to the "H" level in the sense unit SU corresponding to the address ADR. The transistor TR2 is turned on due to the "H" level control signal S1.

The current path of the transistor TR1 is electrically connected to the ground terminal via the on-state transistor TR2.

The transistor TR1 allows a current IDXL to flow between the data wiring DXL and the ground terminal by a driving force corresponding to the voltage of the selected word line WL (LWL or GWL) applied to the gate of the transistor TR1.

As a result, the voltage of the data wiring DXL fluctuates from the precharge voltage VPRC according to the voltage of the selected word line WL.

For example, when the low hold voltage VHLDL is applied to the gate of the transistor TR1, the transistor TR1 allows the current IDXL based on the driving force according to the low hold voltage VHLDL to flow from the data wiring DXL to the ground terminal. The voltage of the data wiring DXL is changed from the precharge voltage VPRC to a voltage V1 due to the generation of the current IDXL.

When the high hold voltage VHLDH is applied to the gate of the transistor TR1, the transistor TR1 allows the current IDXL based on the driving force in accordance with the high hold voltage VHLDH to flow from the data wiring DXL to the ground terminal. The voltage of the data wiring DXL is changed from the precharge voltage VPRC to a voltage V2 by the generation of the current IDXL. The voltage V2 is different from the voltage V1.

As described above, the high hold voltage VHLDH is higher than the low hold voltage VHLDL. The current IDXL when the high hold voltage VHLDH is applied to the transistor TR1 is larger than the current IDXL when the low hold voltage VHLDL is applied to the transistor TR1.

Therefore, when the high hold voltage VHLDH is applied to the selected word line WL, the data wiring DXL is more rapidly discharged compared to when the low hold voltage VHLDL is applied to the selected word line WL. Therefore, the voltage V2 is lower than the voltage V1.

Thus, the voltage VHLD applied to the selected word line WL (and the selected bit line BL) is reflected on the voltage of the data wiring DXL electrically isolated from the selected word line WL.

At time t11, the sequencer 190 changes the signal level of the control signal for the switch RDSW from the "H" level to the "L" level. The switch RDSW is turned off. The gate of the transistor TR1 is electrically isolated from the selected word line WL. The sequencer 190 changes the signal level of the control signal S1 from the "H" level to the "L" level. The transistor TR2 is turned off. The data wiring DXL is electrically isolated from the ground terminal. Accordingly, the sense unit SU connected to the selected word line WL is deactivated.

At time t12, the row control circuit 120 changes the signal level of the control signal for the local word line switch LXSW from the "H" level to the "L" level. The local word line switch LXSW is turned off. The local word line LWL is connected to the wiring 700X via the local word line switch LXSW. Accordingly, the non-select voltage VUSEL is supplied to the local word line LWL.

The column control circuit 130 changes the signal level of the control signal for the local bit line switch LYSW from the "H" level to the "L" level. The local bit line switch LYSW is turned off. The local bit line LBL is connected to the wiring 700Y via the local bit line switch LYSW. Accordingly, the non-select voltage VUSEL is supplied to the local bit line LBL. The column control circuit 130 changes the signal level of the control signal for the global bit line switch GYSW from the "H" level to the "L" level. The global bit line switch GYSW is turned off.

Accordingly, the selected cell MC is deactivated.

The sequencer 190 changes the signal level of the control signal for the switch SKSWY from the "H" level to the "L" level. Accordingly, the sink circuit 143Y is deactivated.

The switches LXSW, LYSW, GYSW, and SKSW may be turned off at different timings (times).

In the period from time t9 to time t12, the sense amplifier circuit 141 senses a signal based on the voltage (the voltage V1 or the voltage V2) of the data wiring DXL. The sense amplifier circuit 141 amplifies the sensed signal.

The data stored in the selected cell MC is determined based on the amplified signal. For example, when the voltage V1 is sensed and amplified, the data in the selected cell MC is determined to be data of "0". For example, when the voltage V2 is sensed and amplified, the data in the selected cell MC is determined to be data of "1". Thus, the output signal (cell data) of the selected cell MC is acquired.

The determined data is transferred from the read/write circuit 140 to the input/output circuit 170 as read data. The input/output circuit 170 transmits the read data to the external device 900.

As described above, the read sequence in the memory device 100 according to the embodiment is completed.

It is noted that the read sequence may be performed using self-reference read. The read sequence using the self-reference read is performed as follows.

In the self-reference read, the output signal (cell data) of the selected cell is acquired by first data read by the operation described above. In the first data read, a signal based on the voltage V1 or a signal based on the voltage V2 is acquired.

After that, the reference data is written in the selected cell by a write operation described later.

The output signal of the selected cell to which the reference data is written is acquired by second data read by the operation described above. In the second data read, for example, a signal based on the voltage V1 is acquired according to the reference data.

The read/write circuit 140 determines the data stored in the selected cell MC based on the comparison between the result of the first data read and the result of the second data read.

The determined data is transmitted to the external device 900 via the input/output circuit 170 as read data.

Thus, the read sequence using the self-reference read in the memory device 100 according to the embodiment is completed.

(b-2) Write Sequence

The write sequence of the memory device 100 according to the embodiment will be described with reference to FIGS. 12A to 14.

(b-2-1) AP Write

The AP write in the write sequence of the memory device 100 according to the embodiment will be described with reference to FIGS. 12A and 13. FIGS. 12A to 12C are timing charts of the write sequence of the AP write of the memory device 100 according to the embodiment. In FIGS. 12A to 12C, the horizontal axis of the graph indicates time. In FIG. 12A, the vertical axis of the graph indicates voltage. In FIG. 12B, the vertical axis of the graph indicates current. In FIG. 12C, the vertical axis of the graph indicates a signal level of the control signal for each element.

Figure 13:
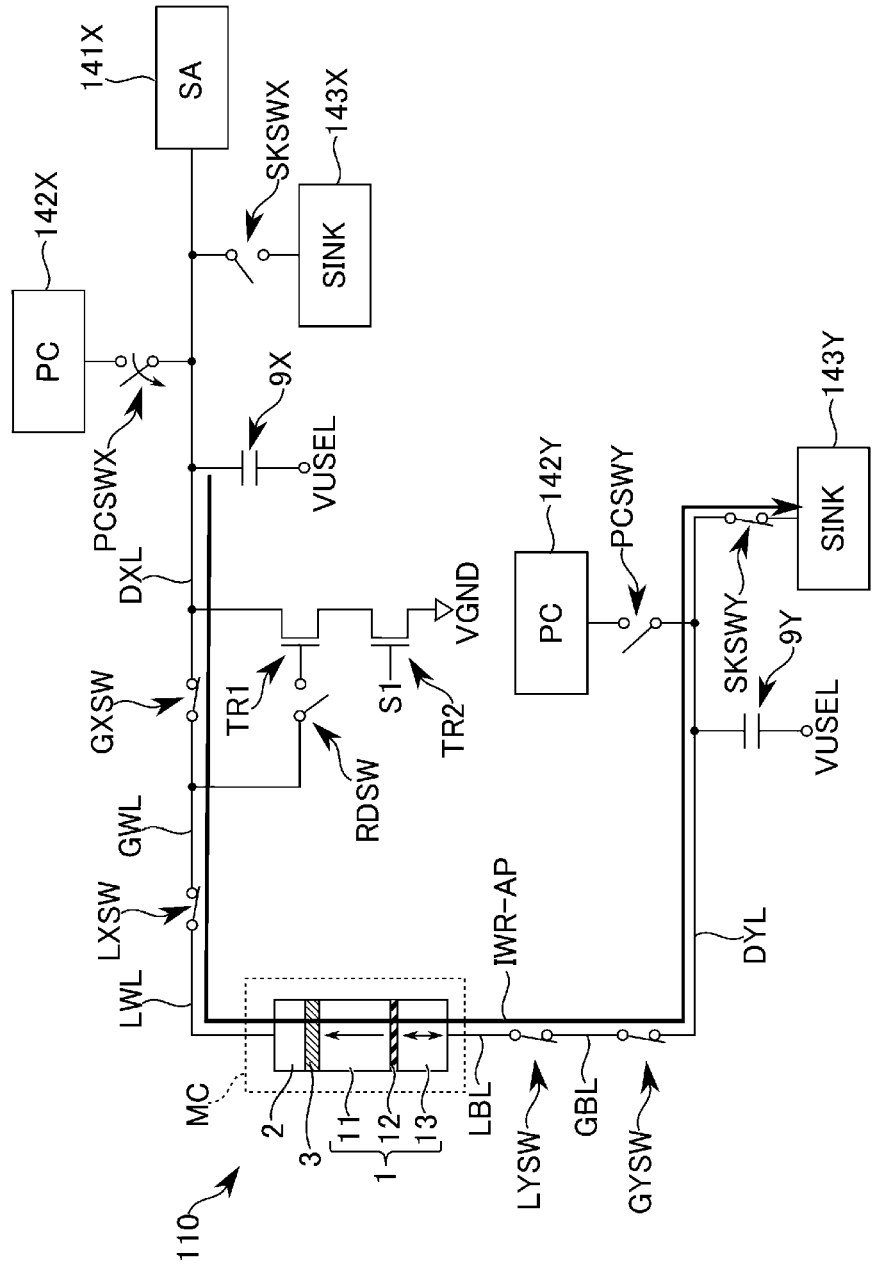
FIGS. 13-15 are schematic block diagrams illustrating a write operation example of the memory device according to the first embodiment.

FIG. 13 is a diagram schematically illustrating a connection state between the elements during the write sequence of the AP write in the memory device 100 according to the embodiment. It is noted that, in FIG. 13, illustration of the elements (for example, non-selected memory cells MC, word lines WL, and bit lines BL) that do not contribute to the operation is omitted.

The AP write is a write operation changing the magnetization arrangement of the MTJ element from the P (parallel) state to the AP (antiparallel) state. In the AP write, the write current flows from the reference layer 11 of the MTJ element 1 to the storage layer 13.

<Times t20, t21, t22, and t23>

The memory device 100 receives the command CMD and the address ADR from the external device 900. The command CMD and the address ADR are transferred from the input/output circuit 170 to the sequencer 190.

The sequencer 190 decodes the command CMD and the address ADR. The sequencer 190 starts the write sequence based on the result of decoding the command CMD. The sequencer 190 transmits the result of decoding the address ADR to the row control circuit 120 and the column control circuit 130.

The row control circuit 120 controls the rows of memory cell array 110 based on the result of decoding the address ADR. The column control circuit 130 controls the columns of memory cell array 110 based on the result of decoding the address ADR.

The selected cell MC corresponding to the address ADR is selected as an operation target of the write sequence.

The read/write circuit 140 starts operations for the write sequence under the control of the sequencer 190.

Similarly to the read sequence, at time t20 before the start of the write sequence, the non-select voltage VUSEL is applied to the word line WL, the bit line BL, the data wiring DXL, and the data wiring DYL.

As illustrated in FIGS. 12A to 12C, at time t21, the row control circuit 120 changes the signal level of the control signal for the local word line switch LXSW corresponding to the address ADR from the "L" level to the "H" level. The local word line switch LXSW corresponding to the address ADR is turned on due to the "H" level signal.

Accordingly, as in FIG. 9 described above, the selected local word line LWL is electrically connected to the global word line GWL via the on-state local word line switch LXSW. It is noted that the non-select voltage VUSEL is applied to the non-selected local word lines LWL.

The row control circuit 120 changes the signal level of the control signal for the global word line switch GXSW corresponding to the address ADR from the "L" level to the "H" level. The global word line switch GXSW corresponding to the address ADR is turned on due to the "H" level signal.

Accordingly, the selected global word line GWL is electrically connected to the data wiring DXL via the on-state global word line switch GXSW.

For example, the non-select voltage VUSEL is applied to the non-selected global word line GWL. The non-selected global word line GWL may be in an electrically floating state.

The column control circuit 130 sets the local bit line switch LYSW and the global bit line switch GYSW corresponding to the address ADR to the off state due to the "L" level control signal. The local bit line LBL and the global bit line GBL corresponding to the address ADR are electrically isolated from the data wiring DYL and the read/write circuit 140.

At time t22, the sequencer 190 changes the signal level of the control signal for the switch PCSWX from the "L" level to the "H" level. The switch PCSWX is turned on due to the "H" level signal. Accordingly, similarly to FIG. 9 described above, the precharging circuit 142X on the word line WL side is electrically connected to the data wiring DXL via the on-state switch PCSWX. The precharging circuit 142X charges the data wiring DXL and the selected word line WL.

At time t23, the voltage of the data wiring DXL and the voltage of the selected word line WL reach the precharge voltage VPRC having a certain voltage value according to the capacitive component 9X.

<Time t24>

At time t24, the sequencer 190 changes the signal level of the control signal for the switch PCSWX from the "H" level to the "L" level.

Accordingly, similarly to FIG. 10 described above, the switch PCSWX is turned off. The precharging circuit 142X is electrically isolated from the data wiring DXL. Accordingly, the precharging circuit 142X is deactivated. The precharging of the selected word line WL and the data wiring DXL is completed.

For example, the magnitude of the precharge voltage VPRC and the magnitude of the capacitive component 9X of the data wiring DXL are set such that the write current has a current amount causing magnetization reversal of the storage layer 13.

As illustrated in FIGS. 12A and 13, in the write sequence of the memory device 100 according to the embodiment, unlike the read sequence, after the precharging of the selected word line WL is completed, the signal level of the control signal of the global word line switch GXSW corresponding to the address ADR is maintained at the "H" level.

Accordingly, after the completion of the precharging of the word line WL, the electrical connection between the selected word line WL and the data wiring DXL is maintained.

<Times t25, t26, t27, t28 and t29>

At time t25, the column control circuit 130 changes the signal level of the control signal for the local bit line switch LYSW corresponding to the address ADR from the "L" level to the "H" level. The local bit line switch LYSW is turned on due to the "H" level signal.

Accordingly, as illustrated in FIG. 13, the selected local bit line LBL is electrically connected to the global bit line GBL via the on-state local bit line switch LYSW.

The column control circuit 130 changes the signal level of the control signal for the global bit line switch GYSW corresponding to the address ADR from the "L" level to the "H" level. The global bit line switch GYSW is turned on due to the "H" level signal.

Accordingly, the selected global bit line GBL is electrically connected to the data wiring DYL via the on-state global bit line switch GYSW.

At time t25, the sequencer 190 changes the signal level of the control signal for the switch SKSWY from the "L" level to the "H" level. The switch SKSWY is turned on due to the "H" level signal. Accordingly, the sink circuit 143Y on the bit line BL side is electrically connected to the data wiring DYL via the on-state switch SKSWY. The sink circuit 143Y draws a current.

The switch SKSWY may be set to the on state at a timing before the global bit line GBL is electrically connected to the data wiring DYL.

The sink circuit 143X is electrically isolated from the data wiring DXL by the off-state switch SKSWX.

In the write sequence, the sense unit SU is deactivated. The switch RDSW is set to the off state. The transistor TR2 is set to the off state due to the "L" level control signal S1.

As illustrated in FIGS. 12A to 12C, the selected bit line BL is discharged by the activated sink circuit 143Y. The voltage of the selected bit line BL is decreased from the non-select voltage VUSEL. At this time, the selected word line WL is electrically isolated from the selected bit line BL and the data wiring DYL by the selected cell MC including the off-state switching element 2. Therefore, when the switching element 2 is in the off state, the voltage of the selected word line WL is not changed even though the selected bit line BL is electrically connected to the sink circuit 143Y.

At certain time t26, the voltage difference between the selected word line WL and the selected bit line BL (corresponding to the cell voltage of the memory cell MC) reaches the threshold voltage Vth of the switching element 2 as the voltage of the selected bit line BL is decreased. Accordingly, the switching element 2 in the selected cell MC is turned on. The selected cell MC including the on-state switching element 2 is activated.

The selected word line WL is electrically connected to the selected bit line BL via the on-state switching element 2.

As a result, as illustrated in FIG. 13, a write current IWR-AP flows from the selected word line WL toward the selected bit line BL. The write current IWR-AP has a current amount causing the magnetization reversal of the storage layer 13 based on the amount of charges accumulated in the capacitive component 9X of the data wiring DXL.

The selected word line WL and the data wiring DXL are discharged by the generation of the write current IWR-AP. The write current IWR-AP is the discharge current of the selected word line WL and the data wiring DXL. Therefore, the current value of the write current IWR-AP becomes larger than the current value of the read current IRD, which is the discharge current of the selected word line WL. In addition, the supply period of the write current IWR-AP depending on the amount of charges charged in the selected word line WL and the data wiring extending in the X-direction becomes longer than the supply period of the read current IRD depending on the amount of charges charged in the selected word line WL.

The voltage of the selected word line WL begins to be decreased according to the timing when the switching element 2 switches to the on state. As described above, in the write sequence, the data wiring DXL is electrically connected to the word line WL by the on-state switches LXSW and GXSW. Therefore, the voltage of the data wiring DXL is decreased similarly to the voltage of the selected word line WL.

Accordingly, the voltages of the selected word line WL and the data wiring DXL are decreased with the elapse of time.

In the write sequence, the charges charged in the data wiring DXL act on the write current IWR-AP. As a result, the magnitude of the current IWR-AP flowing through the selected cell MC during the write sequence becomes sufficiently larger than the current IRD during the read sequence. As a result, the magnetization reversal of the MTJ element 1 may occur.

For example, at time t27, the voltage of the selected bit line BL reaches a certain voltage (for example, a ground voltage VGND).

For example, the write current IWR-AP has the largest current value (peak current) Pk1 at the timing (for example, time t27) when the voltage difference between the selected word line WL and the selected bit line BL is the largest.

For example, the voltages of the selected word line WL and the data wiring DXL are lower than that of the non-select voltage VUSEL. Along with the decrease in the voltages of the selected word line WL and the selected bit line BL, the cell voltage of the selected cell MC is gradually decreased.

At certain time t28, the magnetization direction of the storage layer 13 of the MTJ element 1 in the selected cell MC is reversed by the write current IWR-AP.

Accordingly, the magnetization arrangement of the MTJ element 1 is in the AP state in the selected cell MC. The resistance value of the MTJ element 1 is increased due to the change from the P state to the AP state.

The write current IWR-AP becomes less likely to flow through the inside of the selected cell MC including the MTJ element 1 in the high resistance state. For example, by achieving the high resistance of the MTJ element 1, the divided voltage for the switching element 2 in the cell voltage becomes lower than the divided voltage for the MTJ element 1. Therefore, the switching element 2 is turned off.

As a result, in the embodiment, the supply of the write current IWR-AP to the selected cell MC is stopped.

The voltages of the selected word line WL and the data wiring DXL converge to a certain voltage value between the non-select voltage VUSEL and the ground voltage VGND according to the stoppage of the supply of the write current IWR-AP.

For example, when the voltage difference between the selected word line WL and the selected bit line BL becomes smaller than the threshold voltage Vth of the switching element 2 due to the discharging of the selected word line WL by the write current IWR-AP, the switching element 2 in the selected cell MC is turned off. Accordingly, the write current IWR-AP is decreased and is eventually stopped.

At time t29, the row control circuit 120 changes the signal level of the control signal for the local word line switch LXSW from the "H" level to the "L" level. The local word line switch LXSW is turned off. The row control circuit 120 changes the signal level of the control signal for the global word line switch GXSW from the "H" level to the "L" level. The global word line switch GXSW is turned off. Accordingly, the selected word line WL is electrically isolated from the data wiring DXL.

The column control circuit 130 changes the signal level of the control signal for the local bit line switch LYSW from the "H" level to the "L" level. The local bit line switch LYSW is turned off. The column control circuit 130 changes the signal level of the control signal for the global bit line switch GYSW from the "H" level to the "L" level. The global bit line switch GYSW is turned off. Accordingly, the selected bit line BL is electrically isolated from the data wiring DYL.

As a result, the selected cell MC is deactivated.

The sequencer 190 changes the signal level of the control signal for the switch SKSWY from the "H" level to the "L" level. Accordingly, the sink circuit 143Y is deactivated.

It is noted that the switches LXSW, LYSW, GYSW, and SKSW may be turned off at different timings (times).

As described above, the write sequence of the AP write in the memory device 100 according to the embodiment is completed.

(b-2-2) P Write

Figure 14:
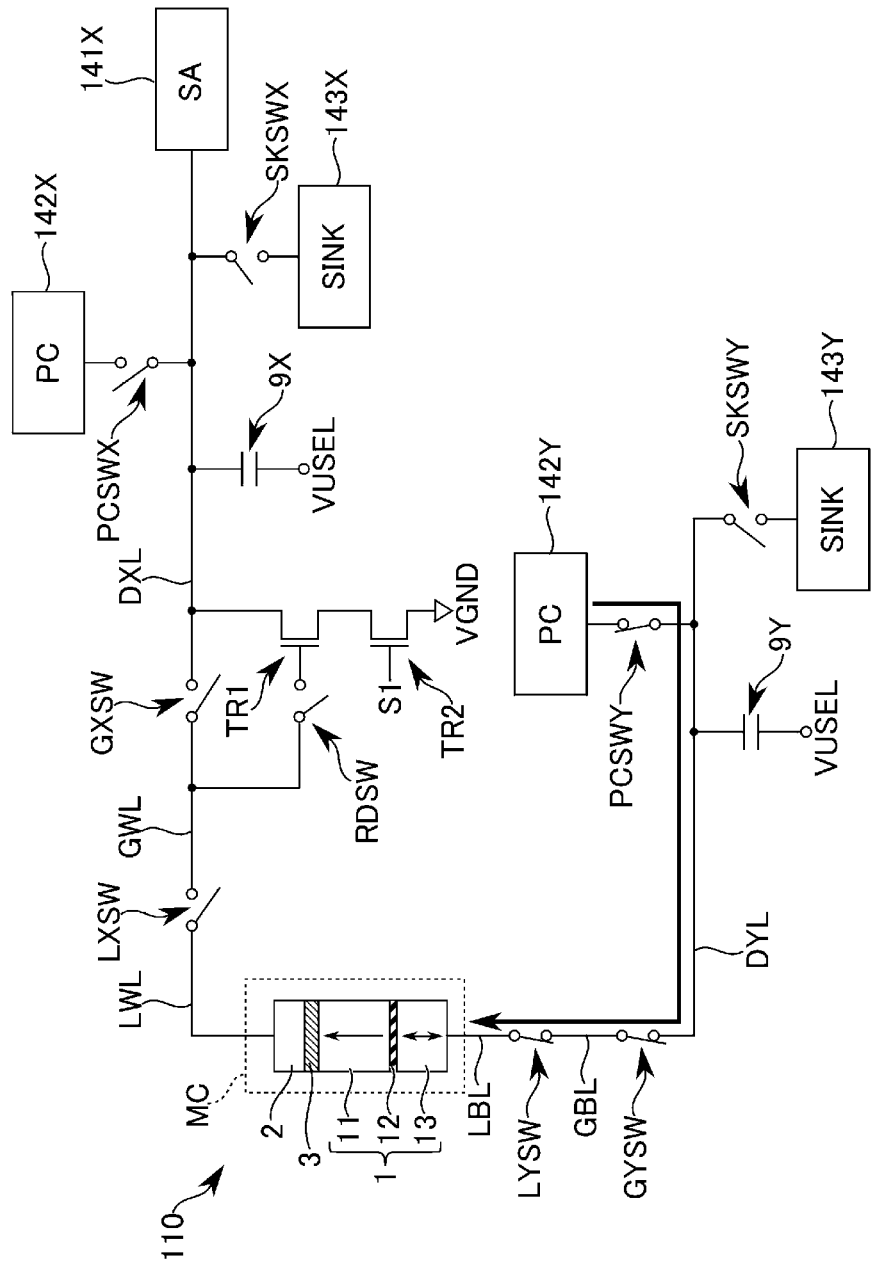
Figure 15:
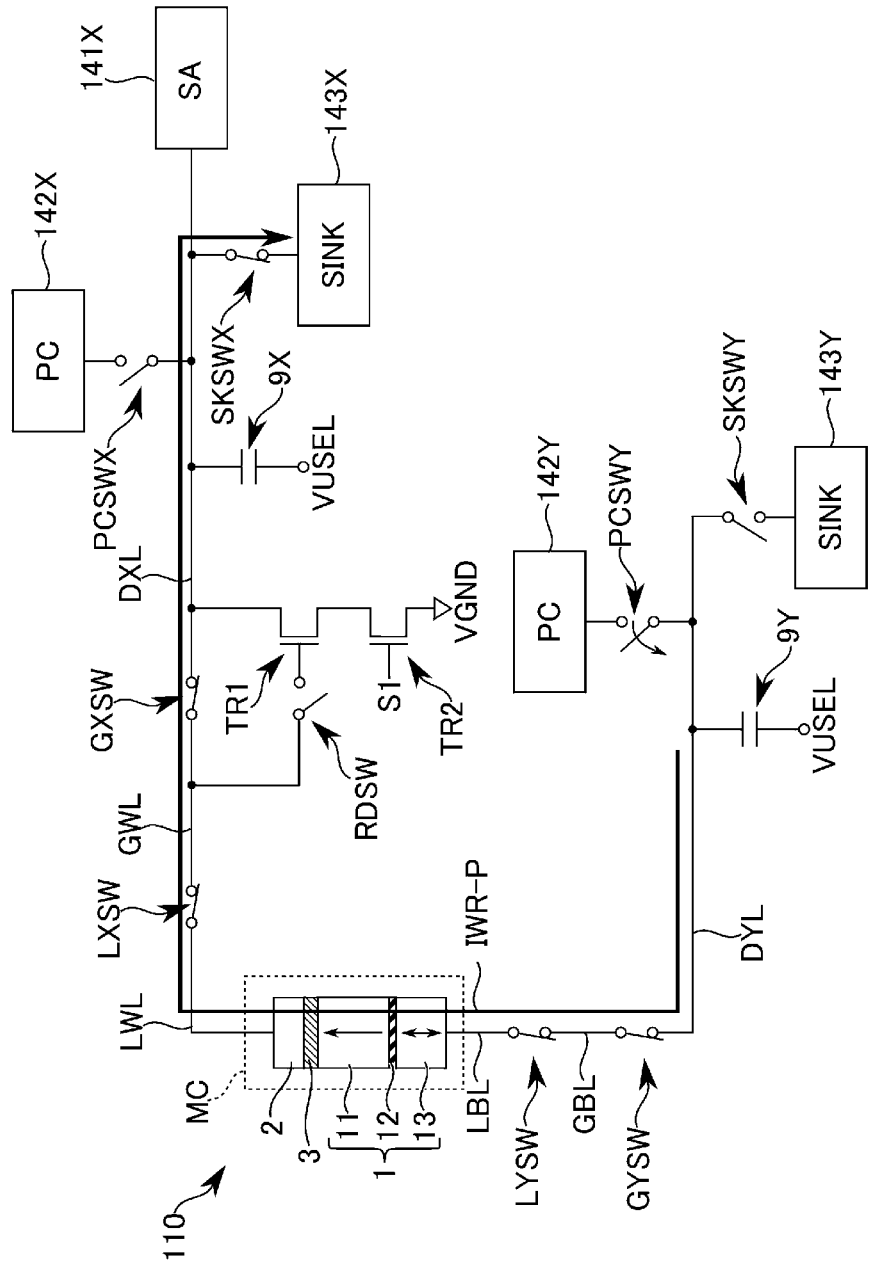

The P write in the write sequence of the memory device 100 according to the embodiment will be described with reference to FIGS. 14 and 15. Each of FIGS. 14 and 15 is a diagram schematically illustrating a connection state between the elements during the write sequence of the P write in the memory device 100 according to the embodiment. It is noted that, in FIGS. 14 and 15, illustration of the elements (for example, the non-selected memory cells MC, word lines WL, and bit lines BL) that do not contribute to the operation is omitted.

The P write in the write sequence of the memory device 100 according to the embodiment is a write operation for changing the magnetization arrangement of the MTJ element from the AP state to the P state. In the P write, a write current IWR flows from the storage layer 13 of the MTJ element 1 to the reference layer 11.

The P write differs from the AP write in the direction in which the write current IWR flows. Therefore, the P write of the write sequence of the memory device 100 is different from the AP write in that the selected bit line BL is set to the high voltage side (precharge side) and the selected word line WL is set to the low voltage side (sink side).

The configuration other than the voltage relationship between the selected word line WL and the bit line BL in the P write (the direction in which a write current IWR-P flows) is substantially the same as the AP write. Therefore, the operation and control of the P write are simplified and described.

As illustrated in FIG. 14, in the write sequence of the P write of the memory device 100 according to the embodiment, based on the command CMD and the address ADR, the column control circuit 130 changes the signal level of the control signal for the local bit line switch LYSW corresponding to the address ADR from the "L" level to the "H" level. The local bit line switch LYSW corresponding to the address ADR is turned on due to the "H" level signal.

Accordingly, the selected local bit line LBL is electrically connected to the global bit line GBL via the on-state local bit line switch LYSW.

The non-select voltage VUSEL is applied to the non-selected local bit lines LBL.

The column control circuit 130 changes the signal level of the control signal for the global bit line switch GYSW corresponding to the address ADR from the "L" level to the "H" level. The global bit line switch GYSW corresponding to the address ADR is turned on due to the "H" level signal.

Accordingly, the selected global bit line GBL is electrically connected to the data wiring DYL via the on-state global bit line switch GYSW.

The sequencer 190 changes the signal level of the control signal for the switch PCSWY from the "L" level to the "H" level. The switch PCSWY is turned on due to the "H" level signal. Accordingly, the precharging circuit 142Y on the bit line BL side is electrically connected to the data wiring DYL via the on-state switch PCSWY. The precharging circuit 142Y charges the data wiring DYL and the bit line BL.

The voltage of the data wiring DYL and the voltage of the bit line BL reach the precharge voltage VPRC having a certain voltage value depending on the capacitive component 9Y.

It is noted that the local word lines LWL, the global word lines GWL, and the data wirings DXL are electrically isolated from each other by the off-state switches LXSW and GXSW. The precharging circuit 142X on the word line WL side is electrically isolated from the data wiring DXL by the off-state switch PCSWX.

As illustrated in FIG. 15, after the precharging of the bit line BL and the data wiring DYL is completed, the precharging circuit 142Y is electrically isolated from the data wiring DYL.

After that, the row control circuit 120 changes the signal level of the control signal for the local word line switch LXSW corresponding to the address ADR from the "L" level to the "H" level. The local word line switch LXSW is turned on due to the "H" level signal.

Accordingly, the selected local word line LWL is electrically connected to the global word line GWL via the on-state local word line switch LXSW.

The row control circuit 120 changes the signal level of the control signal for the global word line switch GXSW corresponding to the address ADR from the "L" level to the "H" level. The global word line switch GXSW is turned on due to the "H" level signal.

Accordingly, the selected global word line GWL is electrically connected to the data wiring DXL via the on-state global word line switch GXSW.

The sequencer 190 changes the signal level of the control signal for the switch SKSWX from the "L" level to the "H" level. The switch SKSWX is turned on due to the "H" level signal. Accordingly, the sink circuit 143X on the word line WL side is electrically connected to the data wiring DXL via the on-state switch SKSWX. The sink circuit 143X draws a current.

The selected word line WL and the data wiring DXL are discharged by the current drawn by the sink circuit 143X. Accordingly, the voltages of the selected word line WL and the data wiring DXL are decreased.

When the voltage difference between the selected word line WL and the selected bit line BL reaches the threshold voltage Vth of the switching element 2 as the voltage of the selected word line WL is decreased, the switching element 2 in the selected cell MC is turned on.

The selected word line WL is electrically connected to the selected bit line BL via the on-state switching element 2.

As a result, as illustrated in FIG. 15, the write current (the cell current) IWR-P flows from the selected bit line BL toward the selected word line WL. The write current IWR-P is a discharge current of the selected bit line BL and the data wiring DYL. The write current IWR-P has a current amount causing the magnetization reversal of the storage layer 13 based on the amount of charges accumulated in the capacitive component 9Y of the data wiring DYL.

The selected bit line BL and the data wiring DXL are discharged by the generation of the write current IWR-P. The voltages of the bit line BL and the data wiring DYL start to be decreased according to the timing when the switching element 2 switches to the on state. Accordingly, the voltages of the selected bit line BL and the data wiring DYL are decreased with the elapse of time.

For example, the voltage of the selected word line WL reaches a certain voltage (for example, a ground voltage VGND).

For example, the write current IWR-P has the largest current value (peak current) at the timing when the voltage difference between the selected word line WL and the selected bit line BL is the largest.

Along with the decrease in the voltages of the selected word line WL and the selected bit line BL, the cell voltage of the selected cell MC is gradually decreased.

At a certain time, the magnetization direction of the storage layer 13 of the MTJ element 1 in the selected cell MC is reversed by the write current IWR-P.

Accordingly, the magnetization arrangement of the MTJ element 1 enters the P state in the selected cell MC. The resistance value of the MTJ element 1 is decreased due to the change from the AP state to the P state.

For example, when the voltage difference between the selected word line WL and the selected bit line BL becomes smaller than the threshold voltage Vth of the switching element 2 due to the discharging of the selected bit line BL by the write current IWR-P, the switching element 2 in the selected cell MC is turned off. Accordingly, the write current IWR-P may be stopped.

After that, the row control circuit 120 deactivates the selected word line WL. The column control circuit 130 deactivates the selected bit line BL. The sequencer 190 deactivates the sink circuit 143X.

Accordingly, the write sequence of the P write in the memory device 100 according to the embodiment is completed.

(c) Summary

As described above, the memory device 100 according to the embodiment generates the cell current (e.g., the read current and the write current) due to the charging and the discharging of the wiring in the read sequence and the write sequence. In the memory device 100 according to the embodiment, in the read sequence, the data wiring DXL to which the sense amplifier circuit 141 is connected is electrically isolated from the selected word line WL. The voltage of the selected word line WL according to the generation of the cell current is reflected on the data wiring DXL by the sense unit SU operating according to the voltage of the selected word line WL. As a result, the memory device 100 according to the embodiment can reduce the occurrence of the read disturbance.

In the write sequence, the memory device 100 according to the embodiment writes data to the memory cell MC by using the write current IWR generated from the charged wiring. Accordingly, the energy for writing data is stabilized at a constant level.

Therefore, the memory device 100 according to the embodiment can reduce the influence of a position dependency of the memory cells MC in the memory cell array 110.

When the resistance state of the memory element is changed from the low resistance state to the high resistance state by writing data, the write current IWR becomes less likely to flow through the memory cell MC at the timing when the resistance state of the memory element is changed to the high resistance state. As a result, in the embodiment, the supply of the write current is automatically stopped without controlling the pulse width of the write current.

Therefore, the memory device 100 according to the embodiment can simplify the configuration and the control for writing data.

In the embodiment, writing data by using the write current IWR having a constant amount of energy is performed for each of the plurality of memory cells MC having variations in characteristics (for example, resistance values).

When the write current IWR is generated due to charging and discharging of each of the data wiring DXL and the data wiring DYL as in the embodiment, the supply period of the current to the memory cell MC having a high resistance value becomes longer than the supply period of the current to the memory cell MC having a low resistance value, so that the reliability of data write is guaranteed according to the characteristics of each memory cell MC.

Therefore, the memory device 100 according to the embodiment is robust with respect to the data write against variations in the characteristics of the plurality of memory cells MC of the memory cell array 110.

As described above, the memory device 100 according to the embodiment can improve the operating characteristics.

(2) Second Embodiment

Figure 16:
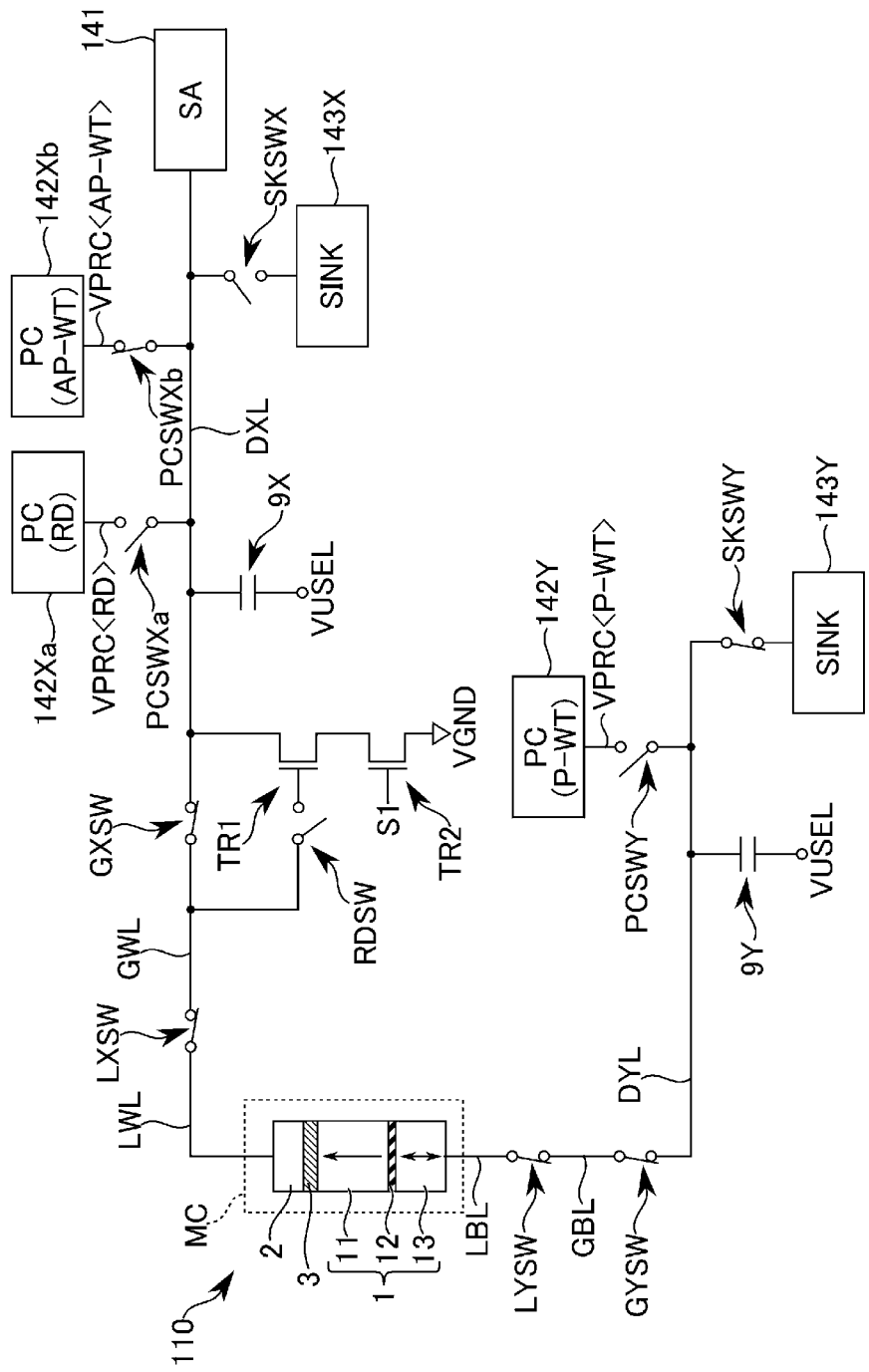
FIG. 16 is a diagram illustrating a configuration example of a memory device according to a second embodiment.

A memory device according to a second embodiment will be described with reference to FIG. 16. FIG. 16 is a schematic diagram illustrating a configuration example of a memory device 100 according to the embodiment. As illustrated in FIG. 16, in the memory device 100 according to the embodiment, two precharging circuits 142Xa and 142Xb are provided for row-side data wirings DXL, GWL, and LWL of the memory cell array 110.

The precharging circuit 142Xa for the read sequence and the precharging circuit 142Xb for the write sequence are connected to the data wiring DXL.

The precharging circuit 142Xa is connected to the data wiring DXL via a switch PCSWXa. In the read sequence, the precharging circuit 142Xa applies a precharge voltage VPRC<RD> for reading data to the data wiring DXL via the on-state switch PCSWXa. The precharge voltage VPRC<RD> is supplied to the global word line GWL and the local word line LWL via the data wiring DXL.

The precharging circuit 142Xb is connected to the data wiring DXL via a switch PCSWXb. During the AP write operation of the write sequence, the precharging circuit 142Xb applies a precharge voltage VPRC<AP-WT> to the data wiring DXL via the on-state switch PCSWXb. The precharge voltage VPRC<AP-WT> is supplied to the global word line GWL and the local word line LWL via the data wiring DXL.

A voltage value of the precharge voltage VPRC<AP-WT> is different from the voltage value of the precharge voltage VPRC<RD>. For example, the precharge voltage VPRC<AP-WT> is larger than the precharge voltage VPRC<RD>.

As described above, the precharging circuit 142Y for the P write is connected to the data wiring DYL. The precharging circuit 142Y applies a precharge voltage VPRC<P-WT> to the data wiring DYL. A voltage value of the precharge voltage VPRC<P-WT> may be different from a voltage value of the precharge voltage VPRC<AP-WT>.

As in the embodiment, when the plurality of precharging circuits 142Xa and 142Xb are provided for the data wiring DXL for each operation sequence to be executed, the voltage of the data wiring DXL can be set to more appropriate values during the read sequence and the write sequence.

As a result, the memory device 100 according to the embodiment can improve reliability of operation.

Therefore, the memory device 100 according to the embodiment can improve the operating characteristics of the memory device.

(3) Third Embodiment

Figure 17:
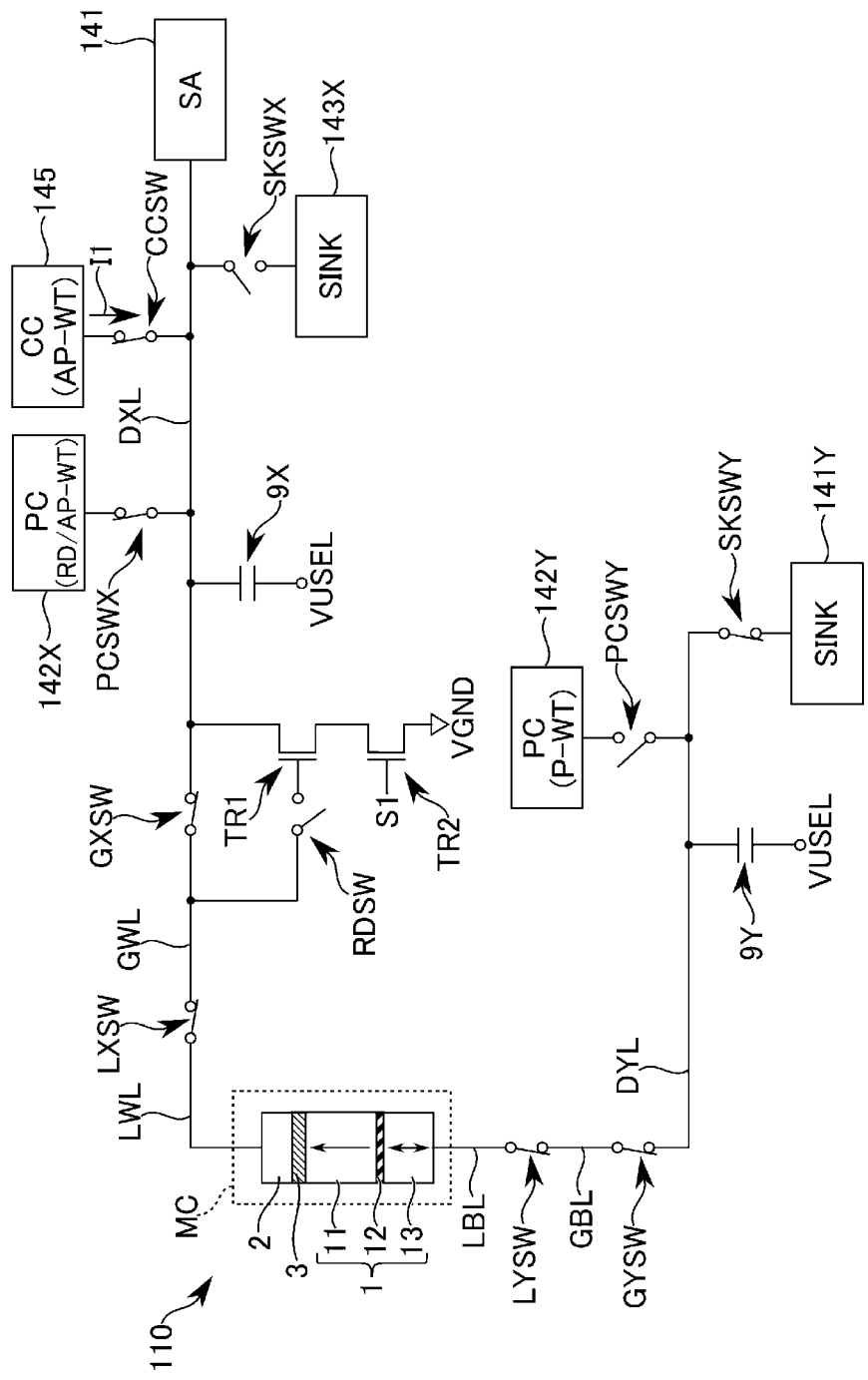
FIG. 17 is a diagram illustrating a configuration example of a memory device according to a third embodiment.

A memory device according to a third embodiment will be described with reference to FIG. 17. FIG. 17 is a schematic diagram illustrating a configuration example of a memory device 100 according to the embodiment. As illustrated in FIG. 17, in the memory device 100 according to the embodiment, a current source circuit 145 is provided for row-side data wirings DXL, GWL, and LWL of the memory cell array 110.

The current source circuit 145 is connected to the data wiring DXL via a switch CCSW.

During the read sequence and during the P write, the current source circuit 145 is electrically isolated from the data wiring DXL by the off-state switch CCSW. During the read sequence and during the P write, the current source circuit 145 does not supply the current to the data wiring DXL.

During AP write, the current source circuit 145 supplies a current I1 having a certain constant current value to the data wiring DXL via the on-state switch CCSW. For example, at the same time as generation of the write current IWR-AP due to the discharging of the data wiring DXL, the current source circuit 145 supplies the current I1 to the selected cell MC. For example, the current value of the current I1 is smaller than the peak value of the write current IWR formed due to the charging and the discharging of the word line WL and the data wiring DXL.

The current value of the write current IWR-AP for the AP write is assisted by the supply of the constant current I1. Accordingly, the reliability of the AP write is improved.

It is noted that the charging of the data wiring DXL and the cell voltage can be accelerated by the charging (precharging) with the precharging circuit 142. Therefore, the AP write speed is secured by the precharging of the data wirings DXL, GWL, and LWL.

The current source circuit 145 may be provided for the column-side data wirings DYL, GBL, and LBL of the memory cell array 110. For example, during the P write, the current source circuit 145 connected to the data wiring DYL supplies a constant current having a certain current value to the data wiring DYL.

As described above, the memory device 100 according to the embodiment can improve the reliability of the data write.

(4) Fourth Embodiment

Figure 18:
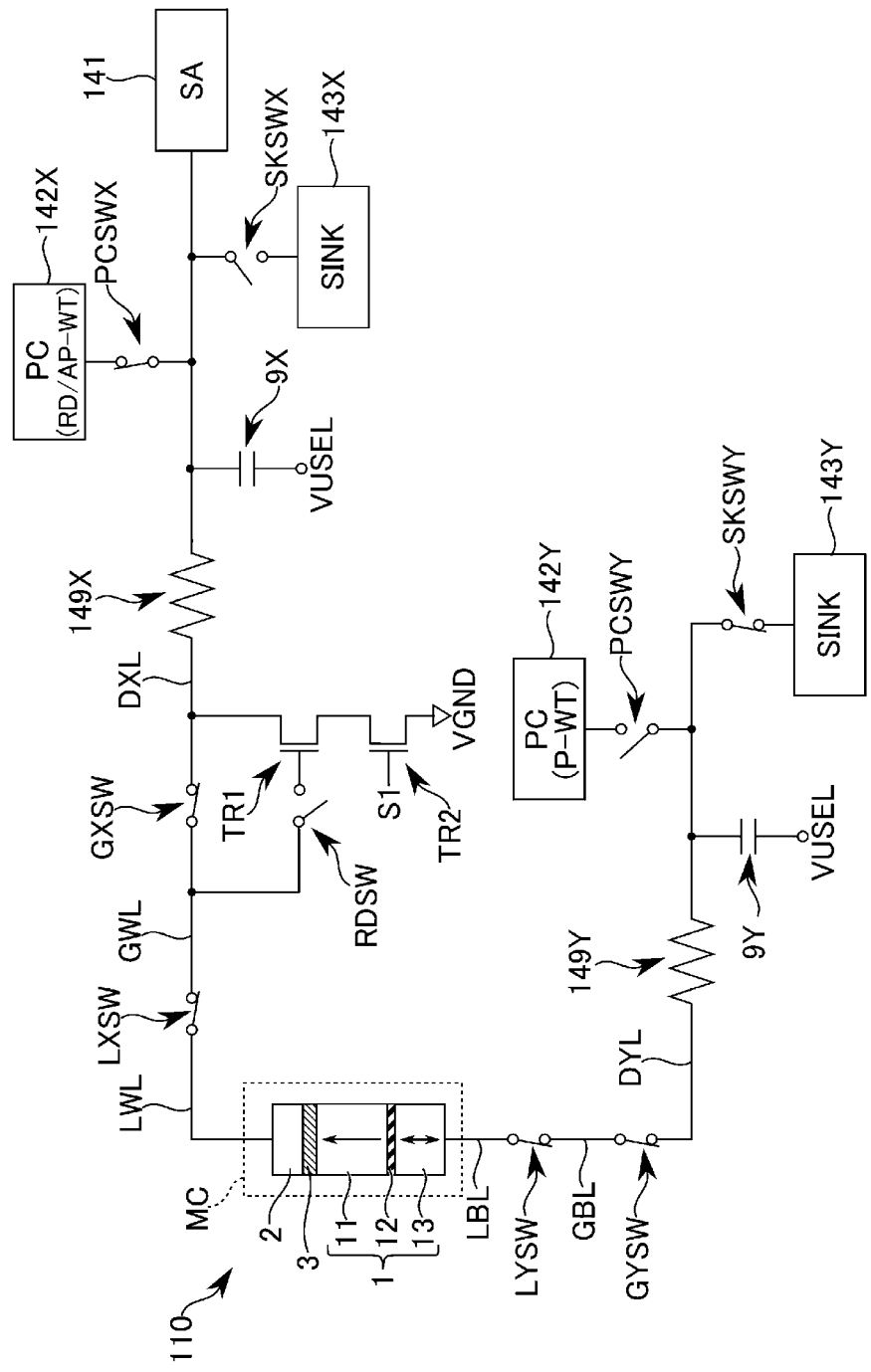
FIG. 18 is a diagram illustrating a configuration example of a memory device according to a fourth embodiment.

A memory device according to a fourth embodiment will be described with reference to FIG. 18. FIG. 18 is a schematic diagram illustrating a configuration example of a memory device 100 according to the embodiment. As illustrated in FIG. 18, in the memory device 100 according to the embodiment, resistors 149 (149X and 149Y) are provided respectively for the row-side data wiring DXL of the memory cell array 110 and the column-side data wiring DYL of the memory cell array 110.

The resistor 149X is provided in the data wiring DXL. For example, one end of the resistor 149X is connected to one end of each of the sense amplifier circuit 141, the precharging circuit 142X, the sink circuit 143X, and the capacitive component 9X. The other end of the resistor 149X is connected to the global word line switch GXSW.

It is noted that, the resistor 149X may be connected between the local word line switch LXSW and the global word line switch GXSW.

The resistor 149Y is provided in the data wiring DYL. For example, one end of the resistor 149Y is connected to one end of each of the precharging circuit 142Y, the sink circuit 143Y, and the capacitive component 9Y. The other end of the resistor 149Y is connected to the global bit line switch GYSW.

It is noted that the resistor 149Y may be connected between the local bit line switch LYSW and the global bit line switch GYSW.

The resistor 149 is formed by using, for example, a semiconductor (for example, silicide), a metal (for example, tungsten), or a compound (for example, silicide).

The resistor 149 functions as a load resistor for each of the data wiring DXL and the data wiring DYL.

In the embodiment, the resistor 149 as a load resistor is inserted into the row-side data wirings DXL, GWL, and LWL of the memory cell array 110 and the column-side data wirings DYL, GBL, and LBL of the memory cell array 110.

Accordingly, during each operation sequence, a peak value (also referred to as a peak current) of the current flowing through the memory cell MC can be reduced.

As a result, the memory device of the embodiment can reduce data write error and/or element deterioration due to excessive current.

As described above, the memory device 100 according to the embodiment can improve the operating characteristics of the memory device.

(5) Fifth Embodiment

A memory device 100 according to a fifth embodiment will be described with reference to FIG. 19. As described above, a plurality of elements (for example, circuits) are connected to a data wiring DXL and a data wiring DYL. The elements connected to the data wiring DXL and the data wiring DYL may be used as capacitive components of the data wiring DXL and the data wiring DYL.

Figure 19:
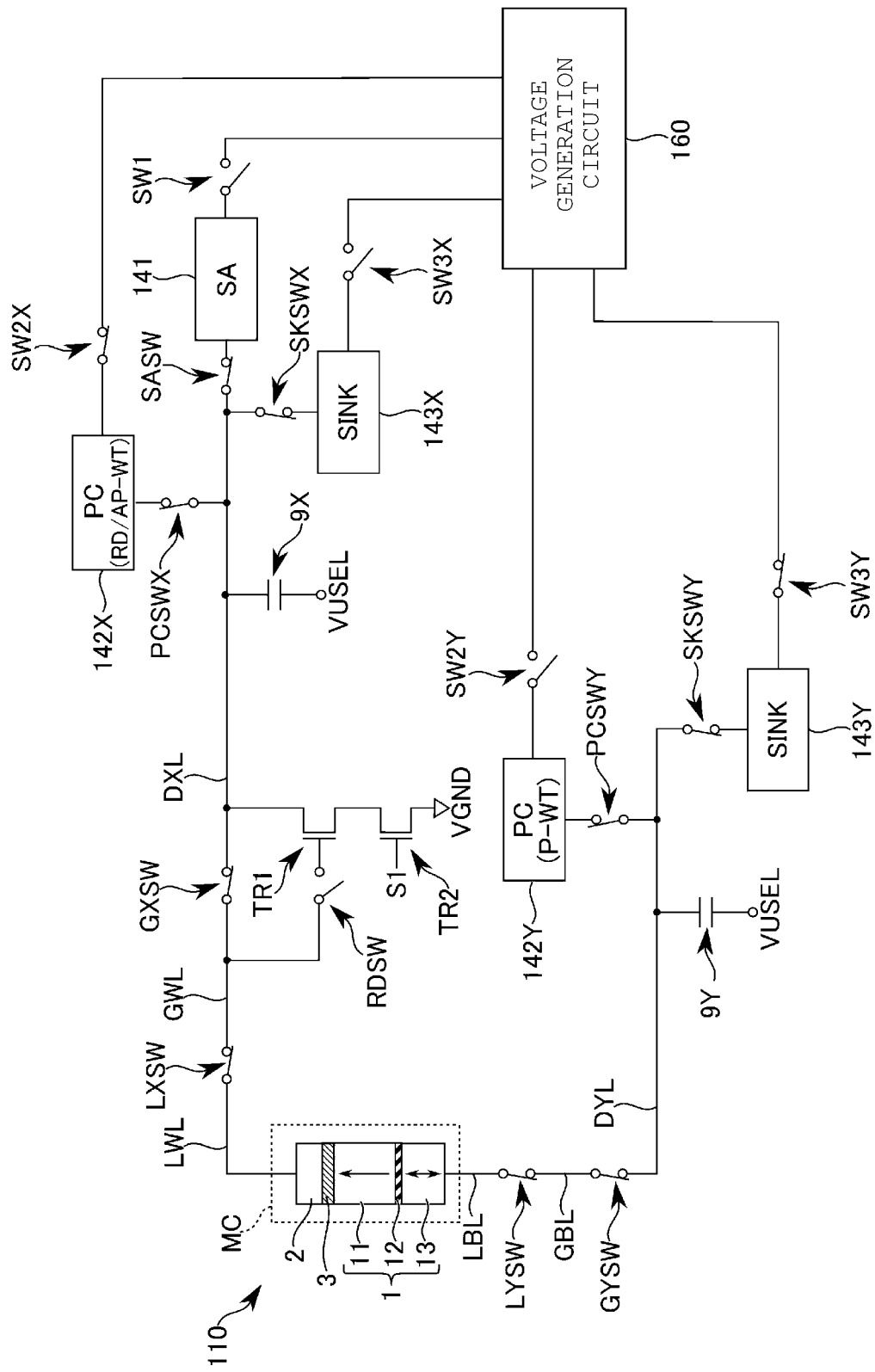
FIG. 19 is a diagram illustrating a configuration example of a memory device according to a fifth embodiment.

FIG. 19 is a schematic diagram illustrating a configuration example of the memory device 100 according to the embodiment.

As illustrated in FIG. 19, the sense amplifier circuit 141, the precharging circuit 142, and the sink circuit 143 are connected to the data wiring DXL and the data wiring DYL. These circuits 141, 142, and 143 operate using the voltage from the voltage generation circuit 160.

For example, the sense amplifier circuit 141 is connected to the voltage generation circuit 160 via a switch SW1. The precharging circuit 142X is connected to the voltage generation circuit 160 via a switch SW2X. The precharging circuit 142Y is connected to the voltage generation circuit 160 via a switch SW2Y. The sink circuit 143X is connected to the voltage generation circuit 160 via a switch SW3X. The sink circuit 143Y is connected to the voltage generation circuit 160 via a switch SW3Y.

The sense amplifier circuit 141 receives a voltage from the voltage generation circuit 160 via the on-state switch SW1 in the read sequence. Accordingly, the sense amplifier circuit 141 operates during the read sequence.

During the write sequence, the sense amplifier circuit 141 is electrically isolated from the voltage generation circuit 160 by the off-state switch SW1. The off-state switch SW1 cuts off the supply of the voltage from the voltage generation circuit 160 to the sense amplifier circuit 141. Accordingly, the sense amplifier circuit 141 does not operate during the write sequence.

Among the precharging circuit 142X and the sink circuit 143X connected to each data wiring DXL, the circuits that are not used in the operation sequence are electrically isolated from the voltage generation circuit 160 by the off-state switches SW2X and SW3X. Accordingly, the supply of the voltage from the voltage generation circuit 160 to the circuits 142X and 143X is cut off.

In this manner, among the sense amplifier circuit 141, the precharging circuit 142X, and the sink circuit 143X, the circuits electrically isolated from the voltage generation circuit 160 do not operate.

In the embodiment, the circuits 141, 142X, and 143X that do not operate are electrically connected to the data wiring DXL via the on-state switches PCSWX and SKSWX.

Among the precharging circuit 142Y and the sink circuit 143Y connected to each data wiring DYL, the circuits that are not used in the operation sequence are electrically isolated from the voltage generation circuit 160 by the off-state switches SW2Y and SW3Y. Accordingly, the supply of the voltage from the voltage generation circuit 160 to the circuits 142Y and 143Y is cut off. Therefore, among the precharging circuit 142Y and the sink circuit 143Y, the circuits electrically isolated from the voltage generation circuit 160 do not operate.

In the embodiment, the circuits 142Y and 143Y that do not operate are electrically connected to the data wiring DYL via the on-state switches PCSWY and SKSWY.

For example, in the write sequence of the AP write, the precharging circuit 142X connected to the data wiring DXL receives a drive voltage (for example, a power supply voltage) from the voltage generation circuit 160 via the on-state switch SW2X. The precharging circuit 142X is electrically connected to the data wiring DXL via the on-state switch PCSWX. Accordingly, the precharging circuit 142X supplies the precharge voltage VPRC to the data wiring DXL.

In the write sequence of the AP write, the sink circuit 143Y connected to the data wiring DYL receives a drive voltage (for example, a power supply voltage) from the voltage generation circuit 160 via the on-state switch SW2Y. The sink circuit 143Y is electrically connected to the data wiring DYL via the on-state switch SKSWY. Accordingly, the sink circuit 143Y is allowed to draw a current.

In the write sequence of the AP write, the sense amplifier circuit 141, the precharging circuit 142Y, and the sink circuit 143X are electrically isolated from the voltage generation circuit 160 by the off-state switches SW1, SW2Y, and SW3X, respectively. Accordingly, the circuits 141, 142Y, and 143X do not operate.

As illustrated in FIG. 19, in the embodiment, the sense amplifier circuit 141 in a state of not operating (non-operating state, non-driving state) is electrically connected to the data wiring DXL via the on-state switch SASW. The precharging circuit 142Y in a state of not operating is electrically connected to the data wiring DYL via the on-state switch PCSWY. The sink circuit 143X in a state of not operating is electrically connected to the data wiring DXL via the on-state switch SKSWX.

The circuits 141, 142Y, and 143X in a state of not operating act on the data wiring DXL and the data wiring DYL as capacitive components (parasitic capacitances).

Accordingly, in the memory device 100 according to the embodiment, when the capacitive elements are connected to the data wiring DXL and the data wiring DYL as the capacitive components 9X and 9Y, the sizes of the capacitive elements connected to the data wiring DXL and the data wiring DYL can be reduced.

As a result, the memory device 100 according to the embodiment can reduce the manufacturing cost of the memory device.

(6) Sixth Embodiment

Figure 20:
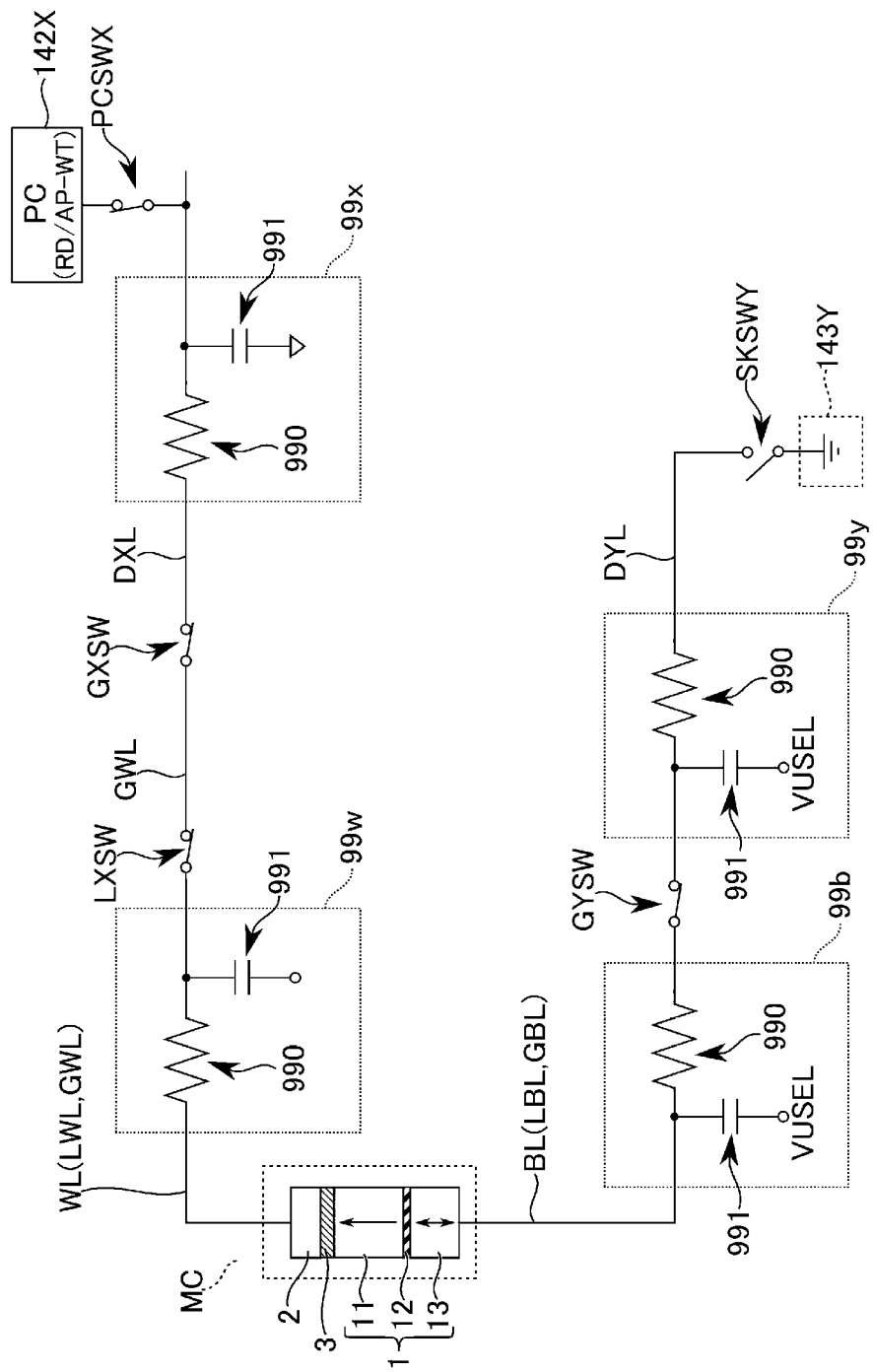
FIG. 20 is a diagram illustrating a memory device according to a sixth embodiment.
Figure 21:
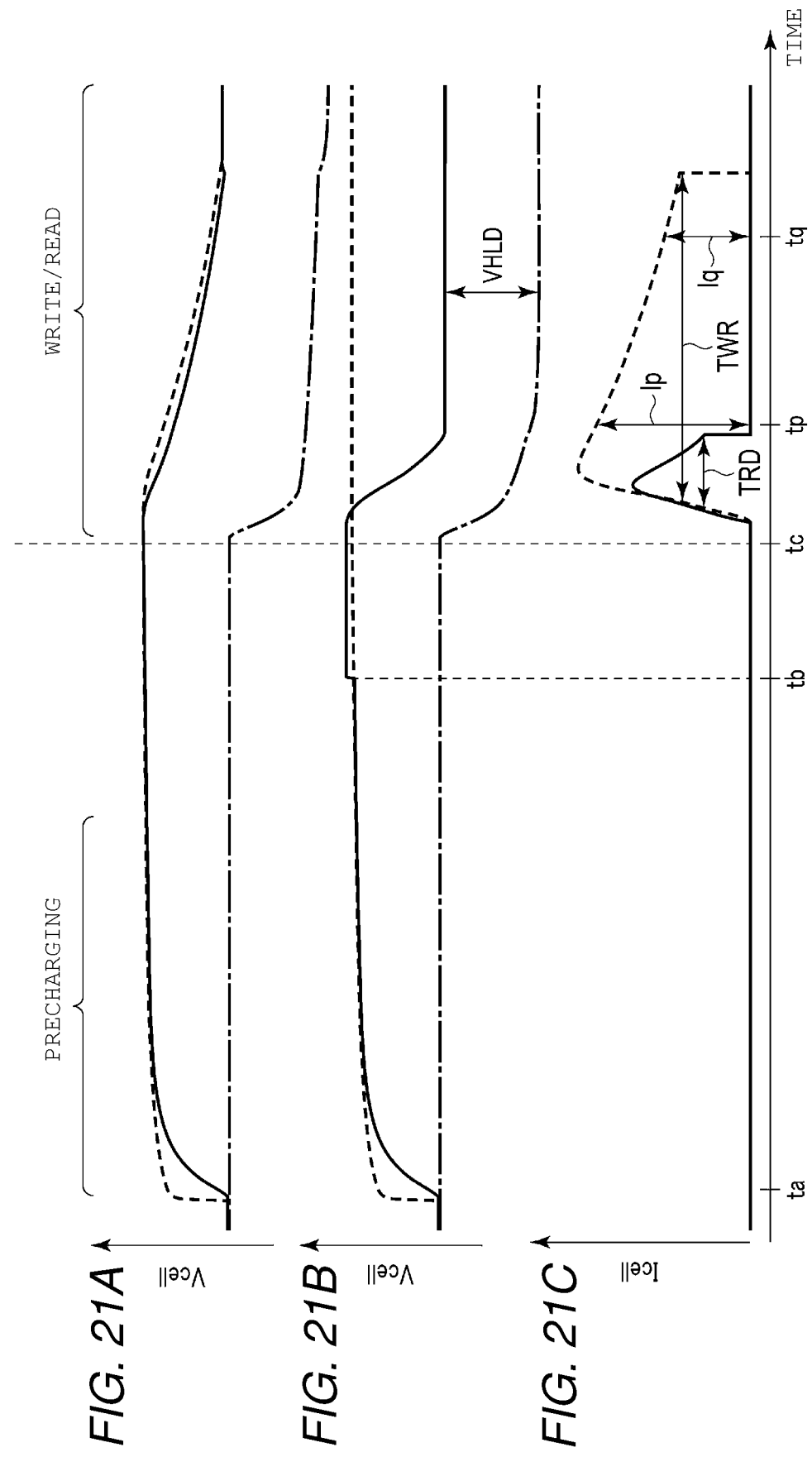
FIGS. 21A to 21C are a diagram illustrating simulation results of write and read operations carried out on the memory device according to the sixth embodiment.

A memory device according to a sixth embodiment will be described with reference to FIGS. 20 to 22. FIG. 20 is a diagram schematically illustrating a circuit configuration when executing a write sequence of AP write in a memory device 100 according to the embodiment.

As illustrated in FIG. 20, in the write sequence of the AP write, the data wiring DXL and the word lines (the global word lines and the local word lines) WL are set to a high voltage side. The data wiring DYL and the bit lines (the global bit lines and the local bit lines) BL are set to a low voltage side.

Each of the data wiring DXL, the data wiring DYL, the word lines WL, and the bit lines BL has a load 99 (99x, 99y, 99w, and 99b). Each load 99 includes a wiring resistance 990 and a wiring capacitance 991. For example, a set of a plurality of the wiring capacitances 991 corresponds to the capacitive component 9 described above.

Herein, the magnitude of each load 99 is temporarily set to have the following relationship. The magnitude of the load 99x on the data wiring DXL is larger than the load 99w on the word line WL. The magnitude of the load 99w on the word line WL is equal to the magnitude of the load 99b on the bit line BL. The magnitude of the load 99x on the data wiring DXL is equal to the magnitude of the load 99y on the data wiring DYL.

FIGS. 21A to 21C are diagrams illustrating simulation results of the write sequence and the read sequence of the memory device 100 having a circuit configuration illustrated in FIG. 20. FIG. 21A illustrates changes in the voltage of the wiring connected to the memory cell MC in the write sequence of the AP write of the memory device 100 of FIG. 20. FIG. 21B illustrates changes in the voltage of the wiring connected to the memory cell MC in the read sequence of the memory device 100 of FIG. 20. FIG. 21C illustrates changes in the cell currents (the write current and the read current) in the write sequence and the read sequence of the memory device 100 of FIG. 20.

In FIGS. 21A and 21B, the horizontal axis of the graph indicates time, and the vertical axis of the graph indicates a voltage. In FIG. 21C, the horizontal axis of the graph indicates time, and the vertical axis of the graph indicates a cell current Icell. In FIGS. 21A and 21B, solid lines correspond to the voltages of the word line WL, broken lines correspond to the voltages of the data wiring DXL, and dashed-dotted lines correspond to the voltages of the bit line BL. In FIG. 21C, a solid line corresponds to the cell current (the read current) during the read sequence, and a dotted line corresponds to the cell current (the write current) during the write sequence.

Similarly to the above example, at time ta, the precharging circuit 142X is electrically connected to the data wiring DXL and the word line WL. According to the activation of the precharging circuit 142X, the word line WL and the data wiring DXL are precharged by the precharging circuit 142X.

During the read sequence, the global word line switch GXSW is turned off after the precharging of the word lines WL and the data wirings DXL is completed. For example, as illustrated in FIG. 21B, at time tb, the voltage of the word line WL is increased at the timing of turning off of the global word line switch GXSW.

At time tc, the sink circuit 143Y is electrically connected to the bit line BL and the data wiring DYL. The voltage of the bit line BL begins to be decreased according to the activation of the sink circuit 143Y.

When the voltage difference between the word line WL and the bit line BL becomes the threshold voltage Vth or more of the switching element 2, the switching element 2 is turned on.

Accordingly, as illustrated in FIG. 21C, a write current IWR-AP is generated in a period TWR in the write sequence. Alternatively, in the read sequence, the read current IRD is generated in a period TRD.

In each of the write sequence and the read sequence, the word line WL is discharged due to the generation of the cell current. As a result, the voltage of the word line WL is decreased.

In the read sequence, at the timing when the switching element 2 is turned off, the supply of the read current IRD is stopped. At this time, a hold voltage corresponding to the resistance state of the MTJ element 1 is retained between the word line WL and the bit line BL. Since the data wiring DXL is electrically isolated from the word line WL, the voltage of the data wiring DXL is maintained.

In the write sequence, the write current IWR is generated from the data wiring DXL and the word line WL. Data is written in the memory cell MC by the write current IWR.

During the read sequence, the charges on the data wiring DXL electrically isolated from the word line WL do not contribute to the current supplied to the memory cell MC. Therefore, the amount of charges (and the amount of current) supplied to the memory cell MC during the read sequence is smaller than the amount of charges supplied to the memory cell MC during the write sequence. As a result, the magnitude of the peak current of the read current IRD is reduced compared to the magnitude of the peak current of the write current IWR. The supply period (corresponding to the pulse width) TRD of the read current IRD is shorter than a supply period TWR of the write current IWR-AP.

In the write sequence of the memory device 100 of the embodiment, it is desirable to set circuit parameters such that a large write current IWR-AP flows for a long time in order to execute the highly reliable AP write. In the read sequence of the memory device 100 of the embodiment, it is desirable to set the circuit parameters such that a small cell current flows only for a short time in order to execute highly reliable data read.

With respect to the circuit executing the write sequence and the read sequence described above, the peak current of the cell current Icell and the supply period of the cell current Icell are determined by a combination of parameters of the wirings DXL, DYL, WL, and BL and the memory cell MC.

For example, the peak current of the cell current Icell can be determined based on the I-V characteristics of the switching element 2. For example, the supply period of the cell current Icell can be determined based on the hold voltage VHLD of the switching element 2.

For designing a more effective circuit configuration, it is desirable that the characteristics of the switching element 2 and the characteristics of the wiring match each other.

In addition, in order to implement the highly reliable write operation and read operation, it is desirable to consider the write error rate (corresponding to magnetization reversal probability) of the MTJ element 1 in the memory cell MC.

In writing data to the MTJ element 1, the magnetization reversal of the MTJ element 1 is considered to be a stochastic process.

Formula (1) is a formula representing a probability density of the magnetization reversal of the MTJ element 1. The probability density of the magnetization reversal of the MTJ element 1 is represented by a time differentiation of the magnetization reversal probability of the MTJ element 1.

$$P_s \propto \exp\left[-\frac{E}{K_B T}\left(1 - \frac{I}{I_c}\right)\right] \quad (1)$$

In Formula (1), "E" indicates a magnetization reversal energy barrier of the storage layer, "kB" indicates the Boltzmann constant, "T" indicates an absolute temperature, and "I" indicates a magnitude of a current supplied to the MTJ element, and "Ic" indicates a magnetization reversal threshold current.

Based on Formula (1), the probability density of the magnetization reversal of the MTJ element 1 is considered to be independent of time.

A write probability (magnetization reversal probability) "P(t)" after time "t" is represented by the following Formula (2).

$$\frac{d}{dt}P(t) = (1 - P(t)) \cdot P_s(t) \quad (2)$$

Based on Formula (2), there is a possibility that a write probability satisfying a desired write error rate can be obtained at the write probability "P(t')" at the time "t'" when the peak current is generated. This indicates that, rather than the supply period of the current, the magnitude of the peak current dominates the magnetization reversal of the MTJ element 1.

Based on these, in the write sequence (and the read sequence) described above, data write in which the occurrence of write errors is prevented can be implemented by high-speed data write with a large peak current and long-time data write complementing the high-speed data write.

For example, as illustrated in FIG. 21C, at time tp, the magnetization reversal of the storage layer 13 by a current Ip having a peak value or a current value near the peak value occurs based on a certain magnetization reversal probability. When the magnetization reversal due to the large current Ip does not occur, the magnetization reversal of the storage layer 13 occurs at time tq after time tp by supply of the write current for a long time. At time tq, the write current IWR has a current Iq smaller than the current Ip.

As described above, the memory cell MC includes the intermediate electrode 3 between the MTJ element 1 and the switching element 2. For example, by controlling the resistance value of the intermediate electrode 3, the magnitude of the peak current of the cell current Icell can be controlled.

The magnitude of the peak current has a trade-off relationship with a margin between the peak current of the write current IWR and the peak current of the read current IRD.

When the peak current is too large, there is a possibility that the elements (for example, the MTJ elements) in the memory cells MC will be destroyed. There is a possibility that the read disturbance due to the peak current of the read current IRD may occur due to the large peak current. When the margin between the peak currents is too small, there is a possibility that the magnetization reversal may not occur due to the peak current of the write current IWR.

Therefore, it is desirable to set the current value of the peak current so as to avoid both the damage and the disturbance of the element.

As one method of setting the peak current, the resistance value of the intermediate electrode 3 is controlled.

Figure 22:
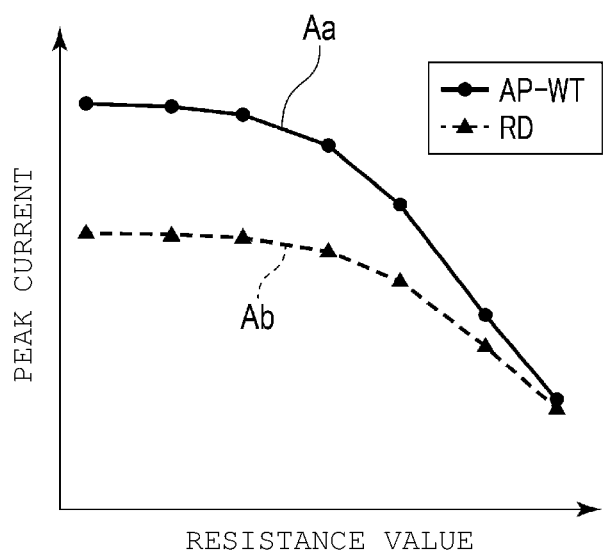
FIG. 22 is a diagram illustrating characteristics of the memory device according to the sixth embodiment.

FIG. 22 is a graph illustrating the relationship between the intermediate electrode 3 of the memory cell MC and the peak current of the cell current. In FIG. 22, the horizontal axis of the graph indicates the resistance value of the intermediate electrode 3, and the vertical axis of the graph indicates the current value of the peak current. In FIG. 22, characteristics Aa indicated by a solid line correspond to the write current, and characteristics Ab indicated by a broken line correspond to the read current.

As illustrated in FIG. 22, the magnitude of the peak current fluctuates according to the resistance value of the intermediate electrode 3.

The margin between the peak current of the write current IWR and the peak current of the read current IRD is decreased as the resistance value of the intermediate electrode 3 is increased.

Figure 23A:
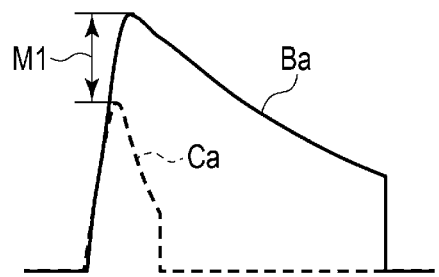
FIGS. 23A and 23B are diagrams illustrating simulated characteristics of the memory device according to the sixth embodiment.
Figure 23B:
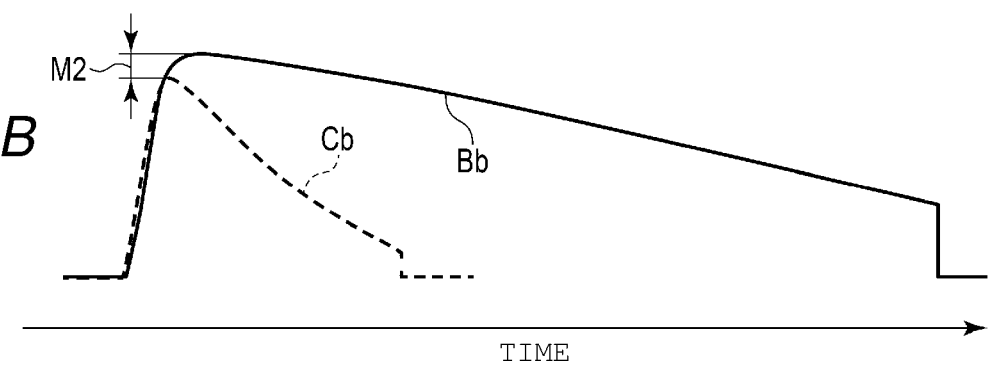

FIGS. 23A and 23B are simulation results illustrating the relationship between the resistance value of the intermediate electrode 3 of the memory cell MC and the supply period of the cell current Icell.

In FIGS. 23A and 23B, the horizontal axis of the graph indicates time, and the vertical axis of the graph indicates the cell current. In FIGS. 23A and 23B, characteristics Ba and Bb by a solid line correspond to the write current IWR-AP in the AP write, and characteristics Ca and Cb by a broken line correspond to the read current.

FIG. 23A illustrates current waveforms of the write current IWR-AP and the read current IRD when the resistance value of the intermediate electrode 3 in the memory cell MC is low. FIG. 23B illustrates current waveforms of the write current IWR-AP and the read current IRD when the resistance value of the intermediate electrode 3 in the memory cell MC is high.

As illustrated in FIGS. 23A and 23B, a margin M2 between the peak value of the write current IWR-AP and the peak value of the read current IRD when the resistance value of the intermediate electrode 3 is high is smaller than a margin M1 between the peak value of the write current IWR-AP and the peak value of the read current IRD when the resistance value of the intermediate electrode 3 is low.

The supply period of the cell currents IWR-AP and IRD when the resistance value of the intermediate electrode 3 is high is longer than the supply period of the cell currents IWR-AP and IRD when the resistance value of the intermediate electrode 3 is low.

In this manner, as the resistance value of the intermediate electrode 3 is increased, the supply period of the current is lengthened.

Shortening of the margin of the cell current Icell and the lengthening of the supply period of the cell current Icell are caused by delay in the discharging of the wiring due to the high resistance of the memory cell MC.

Thus, the current waveform of the cell current Icell can be controlled by controlling the intermediate electrode 3 in the memory cell MC.

As described above, the memory device 100 according to the embodiment can adjust the write current and the read current by controlling the circuit parameters of the components of the memory device.

As a result, the memory device 100 according to the embodiment can improve the reliability of operation in each operation sequence.

Therefore, the memory device 100 according to the embodiment can improve the operating characteristics of the memory device.

(7) Others

In the above-described embodiments, illustrated is an example where the read current IRD and the write current IWR-AP for the AP write flow from the word line WL to the bit line BL, and the write current IWR-P for the P write flows from the bit line BL to the word line WL. However, when the memory device has a configuration that generates the read current and the write current due to the charging and the discharging of the wiring, the read sequence and the write sequence may be performed such that the read current IRD and the write current IWR-AP flow from the bit line BL to the word line WL, and the write current IWR-P flows from the word line WL to the bit line BL. The sense amplifier circuit 141 may be connected to the data wiring DYL on the column side of the memory cell array 110.

In the embodiment, the case where the memory device 100 is an MRAM is illustrated. However, the memory device 100 according to the embodiment may be a memory device other than the MRAM. For example, the memory device 100 according to the embodiment may be a resistance change memory (for example, ReRAM) using a transition metal oxide element as a memory element, or a phase change memory (for example, PCRAM) using a phase-change element as a memory element.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
    a memory cell connected between a first signal line and a second signal line;
    a first wiring connected to the first signal line via a first switch;
    a second wiring connected to the second signal line via a second switch; and
    a first precharging circuit connected to the first wiring,
    wherein, during a write sequence for the memory cell,
    the first precharging circuit charges the first signal line and the first wiring which are connected via the first switch in an on state,
    the memory cell is activated according to a voltage difference between the first signal line and the second signal line, and
    a write current generated from the charged first signal line and the charged first wiring flows from the first wiring to the second wiring via the activated memory cell.

2. The memory device according to claim 1, wherein the memory cell includes:
    a magnetoresistance effect element; and
    a switching element connected in series with the magnetoresistance effect element and configured to turn on or off depending on the voltage difference between the first signal line and the second signal line.

3. The memory device according to claim 2, further comprising a first sink circuit connected to the second wiring,
    wherein the magnetoresistance effect element includes a first ferromagnetic layer having a magnetization direction that is variable, a second ferromagnetic layer having a magnetization direction that is invariable, and a non-magnetic layer between the first ferromagnetic layer and the second ferromagnetic layer, and the second ferromagnetic layer is provided on the first signal line side of the memory cell,
    wherein the first ferromagnetic layer is provided on the second signal line side of the memory cell,
    wherein, after charging of the first signal line and the first wiring, the first sink circuit draws a current from the second signal line,
    wherein, when the voltage difference between the first signal line and the second signal line is larger than or equal to a threshold voltage of the switching element, the switching element is turned on,
    wherein the first sink circuit draws the write current via the switching element in an on state, and
    wherein the write current is decreased according to a change in a resistance state of the magnetoresistance effect element from a low resistance state to a high resistance state.

4. The memory device according to claim 1, further comprising a sense amplifier circuit connected to the first wiring,
    wherein, during a read sequence for the memory cell,
    the first precharging circuit charges the first signal line and the first wiring which are connected via the first switch in an on state,
    after the first signal line and the first wiring are charged, the first switch is turned off,
    the memory cell is activated according to the voltage difference between the first signal line and the second signal line,
    a read current generated from the charged first signal line, which is smaller than the write current, is allowed to flow from the first signal line to the second wiring via the activated memory cell,
    the memory cell is deactivated by discharging of the first signal line and the second signal line, and
    the sense amplifier circuit senses a voltage of the discharged first signal line via the first wiring.

5. The memory device according to claim 4,
    wherein, in the write sequence, the first signal line and the first wiring are connected to the memory cell,
    wherein, in the read sequence, the first signal line is connected to the memory cell, and in the write sequence, a first capacitance of the first signal line and the first wiring is applied to the memory cell,
    wherein, in the read sequence, a second capacitance of the first signal line is applied to the memory cell, and
    wherein the second capacitance is smaller than the first capacitance.

6. The memory device according to claim 4,
    wherein the write current is a first discharge current caused by discharging of the first signal line and the first wiring,
    wherein the read current is a second discharge current caused by the discharging of the first signal line, and wherein a supply period of the second discharge current to the memory cell is shorter than a supply period of the first discharge current to the memory cell.

7. The memory device according to claim 4, further comprising a first sink circuit connected to the second wiring,
wherein the memory cell includes:
a magnetoresistance effect element including a storage layer and a reference layer; and
a switching element configured to turn on or off depending on the voltage difference between the first signal line and the second signal line,
wherein, in the read sequence,
after charging of the first signal line and the first wiring, the first sink circuit draws a current from the second signal line,
when the voltage difference between the first signal line and the second signal line is larger than or equal to a threshold voltage of the switching element, the switching element is turned on,
the first sink circuit draws a current from the first signal line via the switching element in an on state,
when the voltage difference between the first signal line and the second signal line is smaller than the threshold voltage of the switching element, the switching element is turned off, and
after the switching element is turned off, the sense amplifier circuit senses the voltage of the first signal line.

8. The memory device according to claim 1, further comprising:
a first transistor including a first gate connected to the first signal line via a third switch and a first node connected to the first wiring; and
a second transistor including a second gate for receiving a control signal, a third node connected to a second node of the first transistor, and a grounded fourth node.

9. The memory device according to claim 8,
wherein, in the write sequence,
the second transistor is turned off based on the control signal, and
the third switch is turned off, and
wherein, in the read sequence of the memory cell,
the second transistor is turned on based on the control signal,
the third switch is turned on, and
the first transistor allows a current to flow from the first wiring to the fourth node according to the voltage of the first signal line applied to the first gate.

10. The memory device according to claim 1,
wherein the first wiring has a first capacitance,
wherein the second wiring has a second capacitance,
wherein the first signal line has a third capacitance, and
wherein the second signal line has a fourth capacitance.

11. The memory device according to claim 10, further comprising:
a first capacitive element connected to the first wiring; and
a second capacitive element connected to the second wiring.

12. The memory device according to claim 1, further comprising a second precharging circuit connected to the first wiring,
wherein, in the write sequence, the first precharging circuit charges the first signal line and the first wiring with a first voltage, and
wherein, in a read sequence of the memory cell, the second precharging circuit charges the first signal line and the first wiring with a second voltage different from the first voltage.

13. The memory device according to claim 1, further comprising a current source circuit connected to the first wiring,
wherein, in the write sequence, the current source circuit supplies a constant current to the memory cell.

14. The memory device according to claim 1, further comprising:
a first resistor connected to the first wiring; and
a second resistor connected to the second wiring.

15. The memory device according to claim 1, further comprising:
a sense amplifier circuit connected to the first wiring; and
a second sink circuit connected to the first wiring,
wherein, in the write sequence, the sense amplifier circuit in a non-operating state and the second sink circuit in a non-operating state are electrically connected to the first wiring.

16. The memory device according to claim 15, further comprising a voltage generation circuit generating a voltage for an operation of the memory cell,
wherein, in the write sequence, the voltage generation circuit is electrically isolated from the sense amplifier circuit and the second sink circuit.

17. The memory device according to claim 1,
wherein the memory cell includes:
a magnetoresistance effect element;
a switching element configured to turn on or off depending on the voltage difference between the first signal line and the second signal line; and
a conductor provided between the magnetoresistance effect element and the switching element, and
wherein at least one of a supply period of the write current and the current value of the write current is controlled according to a resistance value of the conductor.

18. The memory device according to claim 1,
wherein the first signal line is a word line, and
wherein the second signal line is a bit line.

19. The memory device according to claim 18,
wherein the word line has a hierarchical word line structure, and
wherein the bit line has a hierarchical bit line structure.

20. The memory device according to claim 19,
wherein the hierarchical word line structure includes global word lines and a plurality of local word lines connected to each of the global word lines, and
wherein the hierarchical bit line structure includes global bit lines and a plurality of local bit lines connected to each of the global bit lines.

* * * * *